(12) United States Patent
Zheng

(10) Patent No.: US 11,879,800 B2
(45) Date of Patent: Jan. 23, 2024

(54) MEMS STRAIN GAUGE PRESSURE SENSOR WITH MECHANICAL SYMMETRIES

(71) Applicant: Rosemount Aerospace Inc., Burnsville, MN (US)

(72) Inventor: Jun Zheng, Edina, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 473 days.

(21) Appl. No.: 17/216,049

(22) Filed: Mar. 29, 2021

(65) Prior Publication Data

US 2022/0307929 A1    Sep. 29, 2022

(51) Int. Cl.
*G01L 9/00*    (2006.01)
*B81B 7/00*    (2006.01)

(52) U.S. Cl.
CPC .......... *G01L 9/0051* (2013.01); *B81B 7/0048* (2013.01); *G01L 9/0052* (2013.01);
(Continued)

(58) Field of Classification Search
CPC . G01L 19/147; G01L 9/0072; G01L 19/0645; G01L 19/0084; G01L 13/025; G01L 19/0007; G01L 19/0038; G01L 9/0042; G01L 9/0073; G01L 9/0075; G01L 9/0054; G01L 9/0055; G01L 19/04; G01L 7/00; G01L 7/04; G01L 19/148; G01L 19/14; G01L 19/143; G01L 17/00; G01L 7/18; G01L 19/0092; G01L 15/00; G01L 9/0051; G01L 7/041; G01L 9/065; G01L 9/12; G01L 19/0618; G01L 9/0052; G01L 9/125; G01L 7/16; G01L 19/0609; G01L 19/003; G01L 9/007; G01L 9/0022; G01L 19/0046; G01L 19/0627; G01L 9/06; G01L 7/084; G01L 19/0636; G01L 13/02;
(Continued)

(56) References Cited

U.S. PATENT DOCUMENTS 3,618,376 A * 11/1971 Shull et al. ............. G01L 5/221
73/862.05
5,714,690 A * 2/1998 Burns ................... G01L 9/0042
338/42
(Continued)

OTHER PUBLICATIONS

Extended European Search Report for European Patent Application No. 22163488.4, dated Jul. 8, 2022, 7 pages.

*Primary Examiner* — Andre J Allen
(74) *Attorney, Agent, or Firm* — Kinney & Lange, P.A.

(57) ABSTRACT

A microelectromechanical system (MEMS) strain gauge pressure sensor includes a top wafer stack having a top surface and a first cavity that is configured to receive a first fluid at a first pressure, a backing wafer having a bottom surface opposite the top surface of the top wafer stack; a diaphragm wafer positioned between the top wafer stack and the backing wafer and having a second cavity that is configured to receive a second fluid at a second pressure, and a pedestal connected laterally to the top wafer stack, the backing wafer, and the diaphragm wafer. The diaphragm wafer includes a diaphragm extending between the first cavity and the second cavity, and a resistor positioned on the diaphragm. The MEMS strain gauge pressure sensor has a central axis such that the MEMS strain gauge pressure sensor has mechanical symmetries about the central axis.

20 Claims, 15 Drawing Sheets

(52) U.S. Cl.
CPC .......... *G01L 9/0054* (2013.01); *G01L 9/0055* (2013.01); *G01L 9/0058* (2013.01)

(58) Field of Classification Search
CPC ... G01L 19/0023; G01L 19/142; G01L 7/043; G01L 19/08; G01L 9/0002; G01L 9/008; G01L 19/02; G01L 19/141; G01L 9/006; G01L 11/02; G01L 19/0672; G01L 23/10; G01L 23/18; G01L 19/0681; G01L 9/0077; G01L 19/12; G01L 27/005; G01L 7/082; G01L 9/0044; G01L 19/0069; G01L 19/0015; G01L 7/063; G01L 9/0001; G01L 19/146; G01L 21/12; G01L 27/002; G01L 9/16; G01L 11/00; G01L 27/007; G01L 9/0026; G01L 19/00; G01L 9/0089; G01L 9/045; G01L 9/14; G01L 1/2281; G01L 11/025; G01L 19/0654; G01L 11/008; G01L 7/22; G01L 13/026; G01L 9/0047; G01L 13/00; G01L 9/0025; G01L 9/0076; G01L 9/0035; G01L 19/0061; G01L 9/0005; G01L 9/0019; G01L 9/10; G01L 9/08; G01L 21/00; G01L 7/08; G01L 11/006; G01L 9/0041; G01L 9/04; G01L 19/086; G01L 9/0008; G01L 1/18; G01L 11/004; G01L 19/069; G01L 19/083; G01L 9/0057; G01L 19/10; G01L 9/00; G01L 19/16; G01L 9/0016; G01L 13/023; G01L 7/048; G01L 9/0027; G01L 9/0048; G01L 9/0086; G01L 19/06; G01L 9/0079; G01L 11/04; G01L 9/0091; G01L 23/24; G01L 1/20; G01L 11/002; G01L 7/182; G01L 1/02; G01L 19/0663; G01L 7/166; G01L 23/22; G01L 27/00; G01L 9/0036; G01L 9/0061; G01L 9/0039; G01L 23/125; G01L 9/0013; G01L 19/145; G01L 9/0092; G01L 21/04; G01L 9/0045; G01L 7/104; G01L 9/0033; G01L 1/142; G01L 9/0083; G01L 9/0098; G01L 7/24; G01L 1/2293; G01L 9/02; G01L 21/22; G01L 9/0029; G01L 7/022; G01L 9/0064; G01L 1/205; G01L 23/08; G01L 5/14; G01L 23/16; G01L 7/088; G01L 7/163; G01L 9/0007; G01L 1/16; G01L 13/06; G01L 23/222; G01L 1/2287; G01L 9/0085; G01L 1/2212; G01L 9/0205; G01L 21/14; G01L 9/0004; G01L 23/02; G01L 9/003; G01L 9/085; G01L 1/14; G01L 1/148; G01L 9/0058; G01L 9/105; G01L 7/061; G01L 9/002; G01L 7/02; G01L 13/028; G01L 1/2231; G01L 23/28; G01L 9/0095; G01L 1/162; G01L 19/0076; G01L 7/12; G01L 9/0038; G01L 9/0032; G01L 21/10; G01L 7/024; G01L 19/149; G01L 1/246; G01L 7/086; G01L 1/005; G01L 7/06; G01L 7/102; G01L 1/2206; G01L 13/021; G01L 27/02; G01L 1/2262; G01L 1/24; G01L 1/26; G01L 19/144; G01L 23/00; G01L 9/0094; G01L 9/0082; G01L 1/125; G01L 11/06; G01L 9/0097; G01L 1/2268; G01L 21/30; G01L 21/34; G01L 23/221; G01L 7/187; G01L 7/20; G01L 1/146; G01L 23/26; G01L 7/068; G01L 1/225; G01L 23/32; G01L 7/14; G01L 1/144; G01L 1/165; G01L 23/12; G01L 1/241; G01L 13/04; G01L 7/045; G01L 1/086; G01L 7/108; G01L 9/18; G01L 1/127; G01L 1/22; G01L 17/005; G01L 5/18; G01L 1/245; G01L 21/32; G01L 1/183; G01L 1/2218; G01L 9/0023; G01L 1/243; G01L 23/145; G01L 5/0047; G01L 5/0076; G01L 9/0088; G01L 1/106; G01L 1/10; G01L 9/001; G01L 1/186; G01L 23/223; G01L 25/00; G01L 5/165; G01L 5/226; G01L 9/0017; G01L 1/044; G01L 3/245; G01L 1/08; G01L 21/16; G01L 3/1485; G01L 5/162; G01L 5/225; G01L 7/026; G01L 7/065; G01L 9/0014; G01L 9/005; G01L 1/04; G01L 1/2472; G01L 21/24; G01L 3/10; G01L 5/0004; G01L 5/0052; G01L 1/00; G01L 1/103; G01L 1/2275; G01L 1/247; G01L 21/02; G01L 21/26; G01L 23/225; G01L 3/102; G01L 3/105; G01L 5/0038; G01L 5/223; G01L 5/24; G01L 7/028; G01L 7/10; G01L 9/0011; G01L 5/0028; G01L 5/243; G01L 1/083; G01L 1/12; G01L 21/36; G01L 23/04; G01L 23/14; G01L 23/30; G01L 3/103; G01L 5/00; G01L 5/102; G01L 5/133; G01L 5/166; G01L 7/185; G01L 1/255; G01L 21/08; G01L 5/0033; G01L 5/0057; G01L 5/161; G01L 5/22; G01L 1/042; G01L 1/122; G01L 1/2225; G01L 1/2243; G01L 1/2256; G01L 1/248; G01L 2009/0066; G01L 2009/0067; G01L 2009/0069; G01L 21/06; G01L 23/06; G01L 3/00; G01L 3/06; G01L 3/1478; G01L 3/1492; G01L 3/18; G01L 3/24; G01L 3/242; G01L 5/0061; G01L 5/08; G01L 5/10; G01L 5/101; G01L 5/108; G01L 5/16; G01L 5/1627; G01L 5/167; G01L 5/28; G01L 1/046; G01L 23/085; G01L 23/20; G01L 5/0071; G01L 5/008; G01L 5/06; G01L 5/171; G01L 7/106; H01L 2924/00014; H01L 2224/48091; H01L 2924/00; H01L 2224/73265; H01L 2224/48247; H01L 2224/48137; H01L 29/84; H01L 2924/00012; H01L 2924/181; H01L 2224/45144; H01L 2924/10253; H01L 2224/48227; H01L 2224/8592; H01L 2224/49171; H01L 2924/0002; H01L 2224/48465; H01L 2924/1815; H01L 2924/3025; H01L 2924/1461; H01L 2924/15151; H01L 2224/32225; H01L 2924/01079; H01L 2224/48472; H01L 2224/05554; H01L 24/48; H01L 241/45; H01L 2924/14; H01L 2224/45124; H01L 2924/16152; H01L 21/67253; H01L 2924/01013; H01L 2224/49175; H01L 2924/01006; H01L 2924/16151; H01L 2924/01033; H01L 2924/01078; H01L 2924/01082; H01L 2924/01322; H01L 2224/32245; H01L 2924/10155; H01L 2224/16225; H01L 2924/01005; H01L 2924/13091; H01L 2924/16195; H01L 2224/48464; H01L 24/32; H01L 2924/014; H01L 2924/1305; H01L 2924/3011; H01L 2224/05553; H01L 2224/45099; H01L 23/057; H01L 24/49; H01L 2924/15153;

H01L 2224/05644; H01L 2924/01014; H01L 2924/01047; H01L 2924/09701; H01L 2924/19107; H01L 24/05; H01L 241/73; H01L 29/66007; H01L 2924/01046; H01L 2924/10158; H01L 2924/1433; H01L 2924/01023; H01L 2924/01029; H01L 2924/01074; H01L 2924/15165; H01L 2924/15311; H01L 2224/02166; H01L 2224/04042; H01L 2224/05599; H01L 23/24; H01L 23/49575; H01L 24/24; H01L 24/80; H01L 24/82; H01L 25/16; H01L 2924/19105; H01L 2924/30105; H01L 2924/351; H01L 21/00; H01L 21/2007; H01L 21/6835; H01L 2224/04105; H01L 2224/05568; H01L 2224/05573; H01L 2224/24137; H01L 2224/48699; H01L 2224/48744; H01L 2224/73257; H01L 24/19; H01L 2924/01024; H01L 2924/01027; H01L 2924/12042; H01L 2924/15156; H01L 2924/15747; H01L 2924/15787; H01L 2924/19042; H01L 21/568; H01L 22/12; H01L 2224/05001; H01L 2224/45015; H01L 2224/73204; H01L 2224/81801; H01L 2224/8385; H01L 23/5389; H01L 24/83; H01L 27/00; H01L 2924/01004; H01L 2924/07811; H01L 2924/207; H01L 21/30608; H01L 21/3065; H01L 21/31111; H01L 21/76897; H01L 22/34; H01L 2224/05124; H01L 2224/16227; H01L 2224/16235; H01L 2224/16245; H01L 2224/32145; H01L 2224/45147; H01L 2224/45169; H01L 2224/48644; H01L 2224/81805; H01L 2224/83805; H01L 23/16; H01L 23/291; H01L 23/49503; H01L 24/06; H01L 24/85; H01L 25/0652; H01L 28/20; H01L 29/00; H01L 2924/01015; H01L 2924/01028; H01L 2924/01039; H01L 2924/0105; H01L 2924/01057; H01L 2924/01058; H01L 2924/0106; H01L 2924/01068; H01L 2924/01072; H01L 2924/01073; H01L 2924/12032; H01L 2924/12044; H01L 2924/19041; H01L 21/67132; H01L 2224/05624; H01L 2224/05647; H01L 2224/08245; H01L 2224/12105; H01L 2224/13; H01L 2224/2612; H01L 2224/26175; H01L 2224/48145; H01L 2224/48147; H01L 2224/48195; H01L 2224/80805; H01L 2224/80893; H01L 2224/80894; H01L 2224/83385; H01L 2224/8389; H01L 2224/92247; H01L 23/04; H01L 23/053; H01L 23/3121; H01L 23/49811; H01L 23/49877; H01L 23/66; H01L 24/03; H01L 24/08; H01L 24/18; H01L 24/96; H01L 25/167; H01L 27/0688; H01L 2924/00015; H01L 2924/01012; H01L 2924/01067; H01L 2924/01077; H01L 2924/15192; H01L 2924/16235; H01L 2924/18162; H01L 31/0203; H01L 21/02126; H01L 21/02203; H01L 21/02216; H01L 21/02274; H01L 21/0273; H01L 21/0334; H01L 21/3105; H01L 21/31; H01L 21/32053; H01L 21/324; H01L 21/4842; H01L 21/561; H01L 21/67017; H01L 21/67069; H01L 21/67201; H01L 21/67276; H01L 21/6838; H01L 21/76; H01L 21/76297; H01L 21/764; H01L 21/7682; H01L 21/78; H01L 22/10; H01L 22/32; H01L 2221/00; H01L 2221/68359; H01L 2221/68363; H01L 2224/023; H01L 2224/02379; H01L 2224/05073; H01L 2224/05155; H01L 2224/05166; H01L 2224/05558; H01L 2224/0558; H01L 2224/056; H01L 2224/05669; H01L 2224/16145; H01L 2224/24011; H01L 2224/24051; H01L 2224/24226; H01L 2224/24227; H01L 2224/24998; H01L 2224/2518; H01L 2224/29099; H01L 2224/45014; H01L 2224/451; H01L 2224/48225; H01L 2224/48257; H01L 2224/48455; H01L 2224/48463; H01L 2224/48475; H01L 2224/48599; H01L 2224/48624; H01L 2224/48647; H01L 2224/48724; H01L 2224/48747; H01L 2224/48799; H01L 2224/48844; H01L 2224/49; H01L 2224/49109; H01L 2224/49113; H01L 2224/49173; H01L 2224/72; H01L 2224/73267; H01L 2224/76155; H01L 2224/78313; H01L 2224/78318; H01L 2224/82007; H01L 2224/82102; H01L 2224/82103; H01L 2224/8319; H01L 2224/85051; H01L 2224/85148; H01L 2224/85203; H01L 2224/85206; H01L 2224/85444; H01L 2224/85909; H01L 23/051; H01L 23/08; H01L 23/10; H01L 23/15; H01L 23/29; H01L 23/293; H01L 23/315; H01L 23/467; H01L 23/4821; H01L 23/4951; H01L 23/49513; H01L 23/49541; H01L 23/49548; H01L 23/49805; H01L 23/562; H01L 23/576; H01L 24/10; H01L 24/26; H01L 24/76; H01L 24/78; H01L 24/81; H01L 25/03; H01L 25/041; H01L 25/50; H01L 27/0248; H01L 27/0629; H01L 27/14643; H01L 27/14685; H01L 28/40; H01L 29/0657; H01L 29/66; H01L 29/7804; H01L 2924/0001; H01L 2924/00013; H01L 2924/01007; H01L 2924/0101; H01L 2924/01019; H01L 2924/01026; H01L 2924/0104; H01L 2924/01041; H01L 2924/01042; H01L 2924/01051; H01L 2924/01076; H01L 2924/0133; H01L 2924/04642; H01L 2924/04941; H01L 2924/05042; H01L 2924/07802; H01L 2924/10161; H01L 2924/12036; H01L 2924/1301; H01L 2924/13062; H01L 2924/15174; H01L 2924/1531; H01L 2924/15788; H01L 2924/163; H01L 2924/19043; H01L 2924/206; H01L 2924/30107; H01L 31/00; H01L 33/0025; H01L 21/02282; H01L 21/314; H01L 21/56; H01L 21/67051; H01L 21/823828; H01L 21/823864; H01L 22/00; H01L 2224/0603; H01L 2224/16; H01L 2224/18; H01L 2224/48106; H01L 2224/4813; H01L 2224/4847; H01L

2224/49052; H01L 2224/82951; H01L 2224/85399; H01L 23/481; H01L 23/4952; H01L 23/49558; H01L 23/49861; H01L 23/5226; H01L 23/552; H01L 23/62; H01L 24/09; H01L 25/165; H01L 29/0669; H01L 29/0673; H01L 29/24; H01L 29/786; H01L 2924/10326; H01L 2924/152; H01L 2924/1627; H01L 31/02327; H01L 31/16; B81B 7/0048

USPC .................................................. 73/700–756

See application file for complete search history.

(56) References Cited

U.S. PATENT DOCUMENTS

| | | | |
|---|---|---|---|
| 8,984,950 | B2 | 3/2015 | Potasek |
| 9,010,190 | B2 * | 4/2015 | Potasek ................. B81B 7/0048 73/715 |
| 9,054,222 | B2 | 6/2015 | Tham et al. |
| 9,863,830 | B2 | 1/2018 | Drewes et al. |
| 10,126,193 | B2 | 11/2018 | Sanden et al. |
| 2013/0276544 | A1 | 10/2013 | Potasek et al. |
| 2015/0247774 | A1 | 9/2015 | Wagner et al. |
| 2016/0229688 | A1 * | 8/2016 | Gu ........................ B81B 7/0048 |
| 2017/0176279 | A1 * | 6/2017 | Tokuda ................... G01L 13/02 |
| 2022/0316973 | A1 * | 10/2022 | Potasek ................. G01L 9/0052 |

* cited by examiner

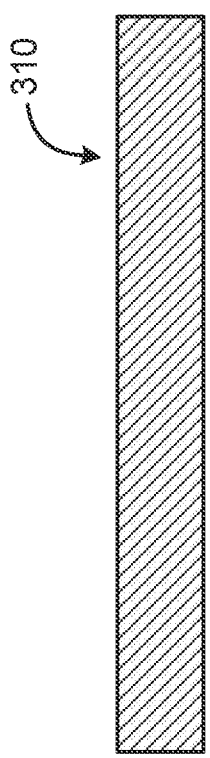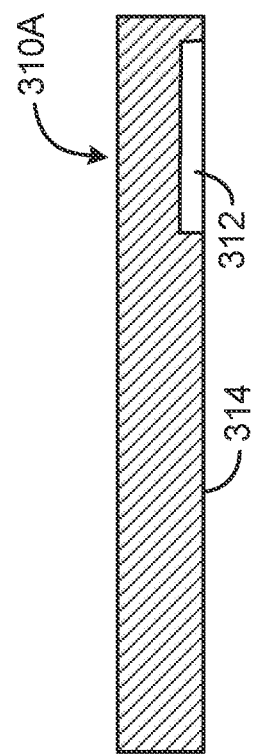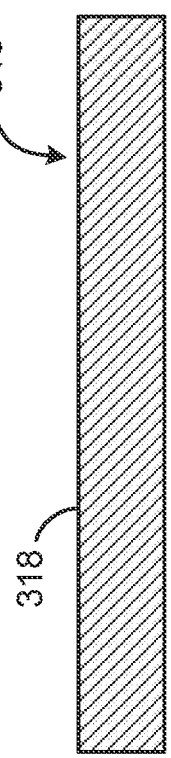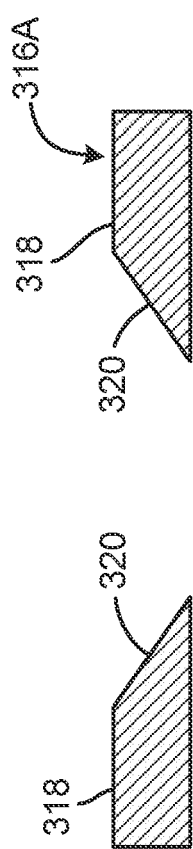

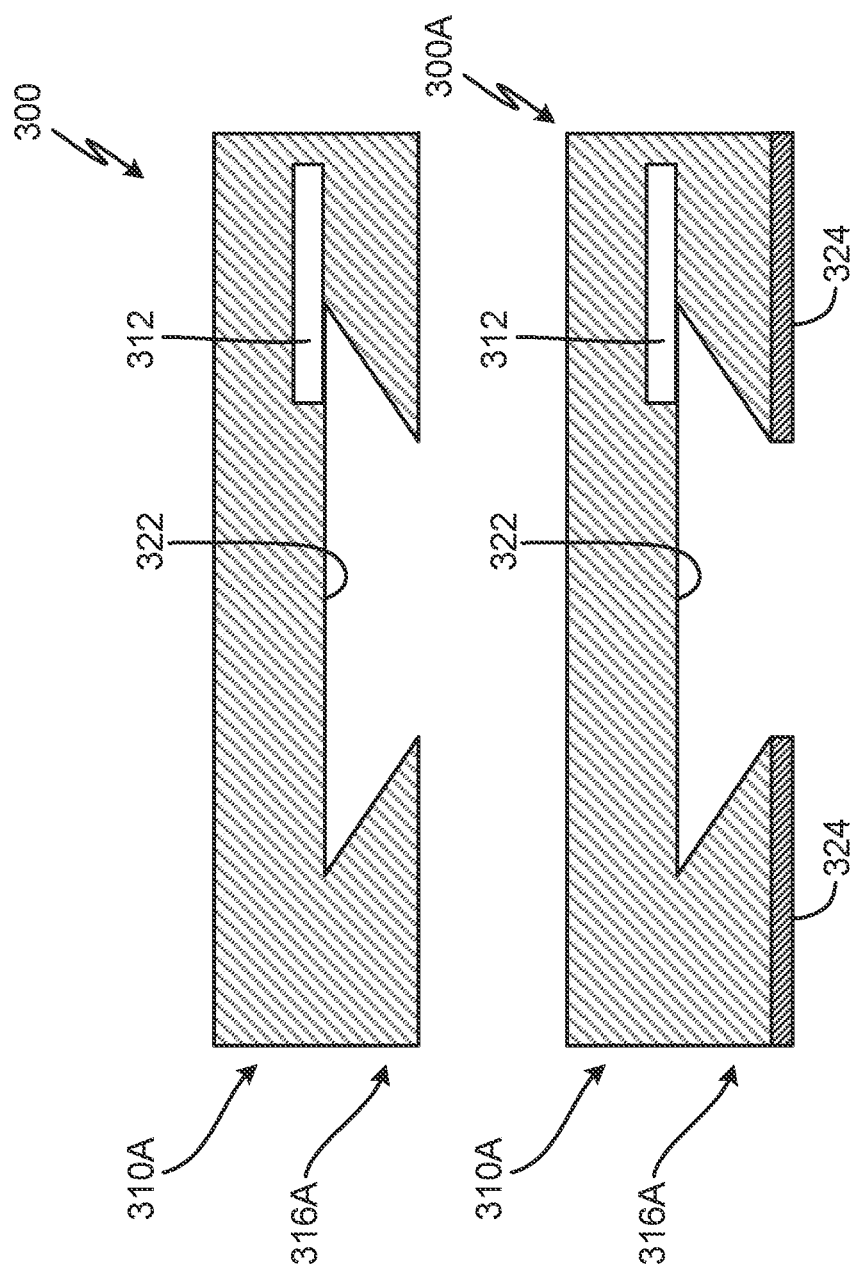

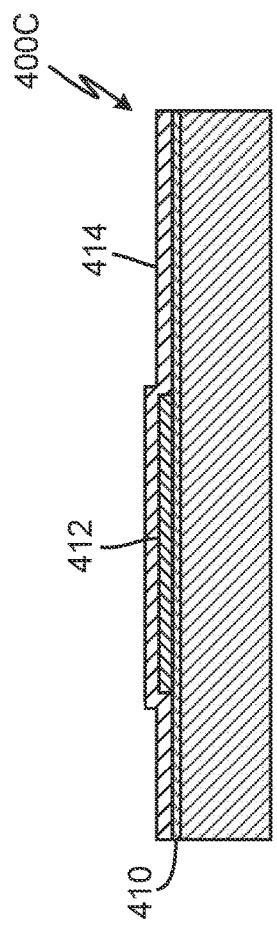
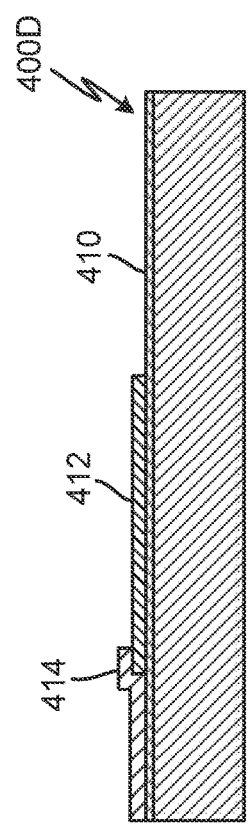
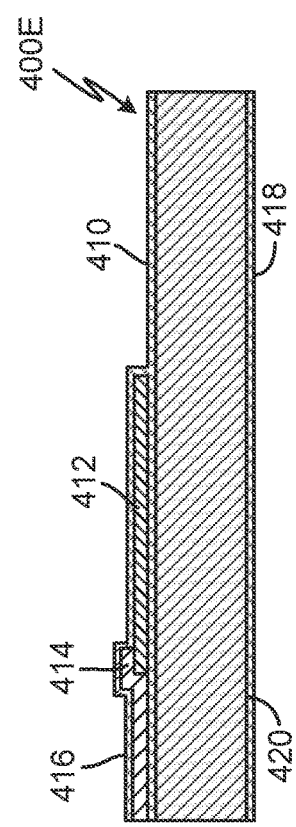
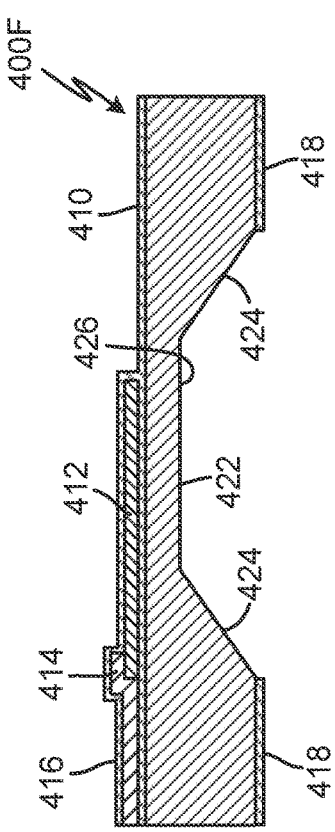

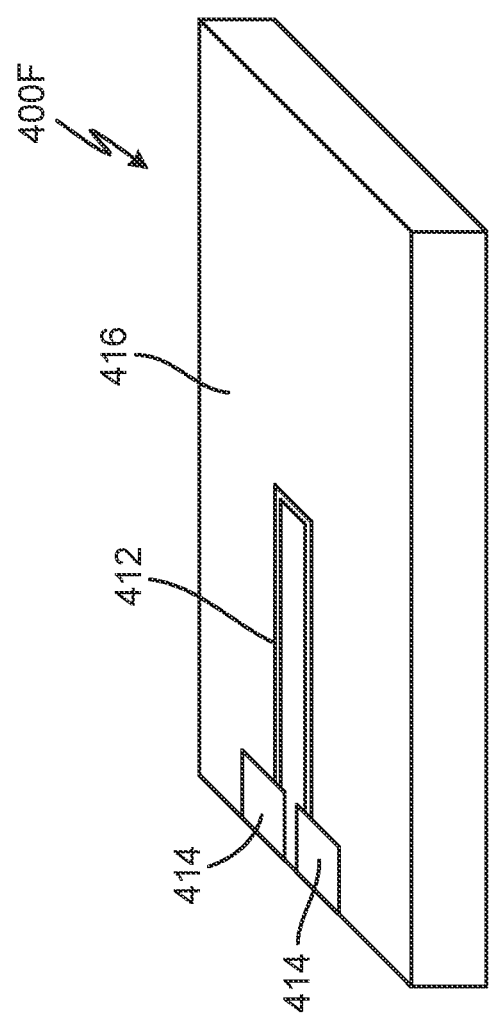

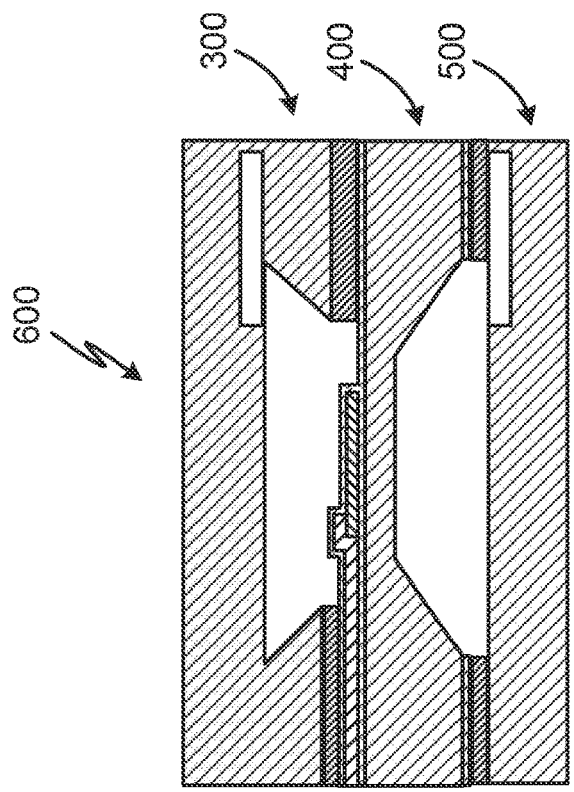
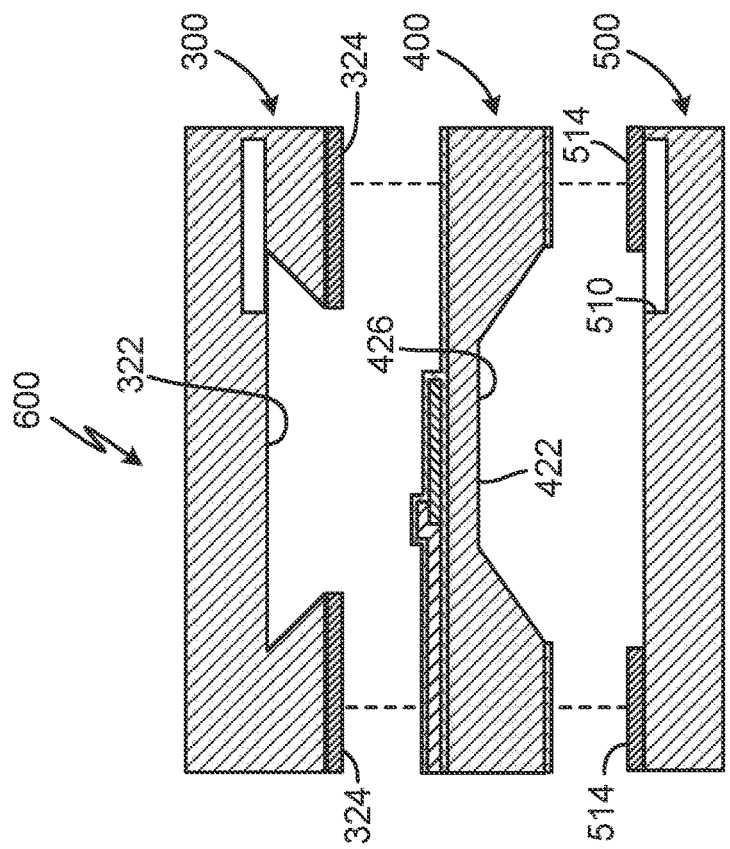

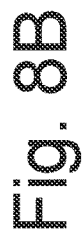
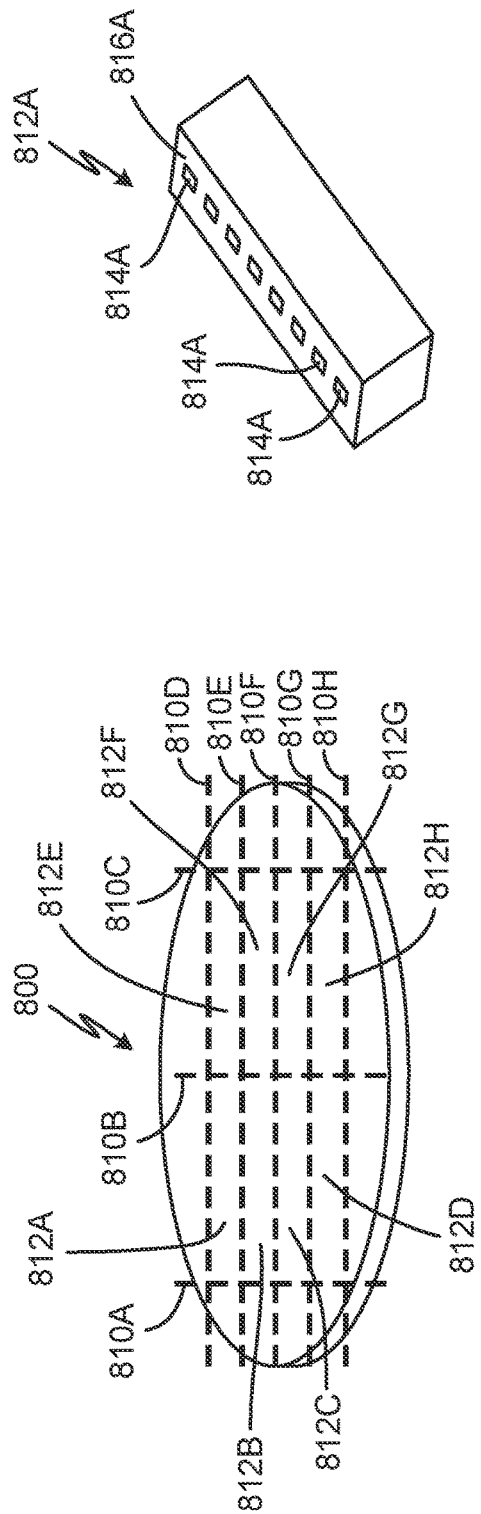
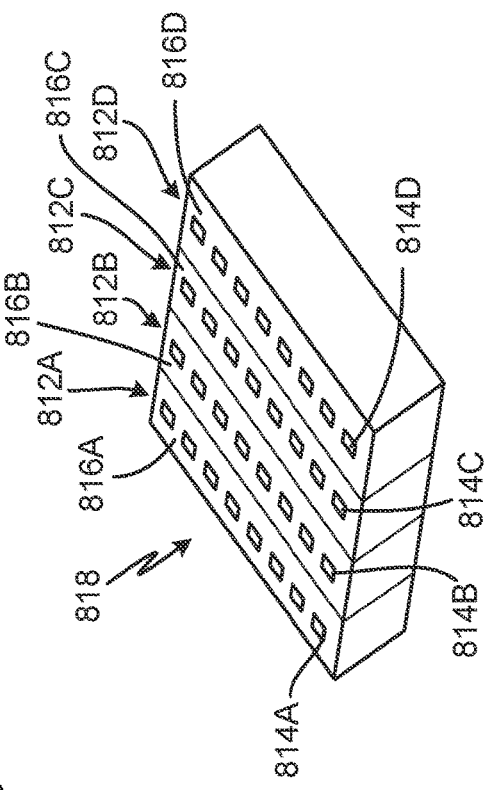

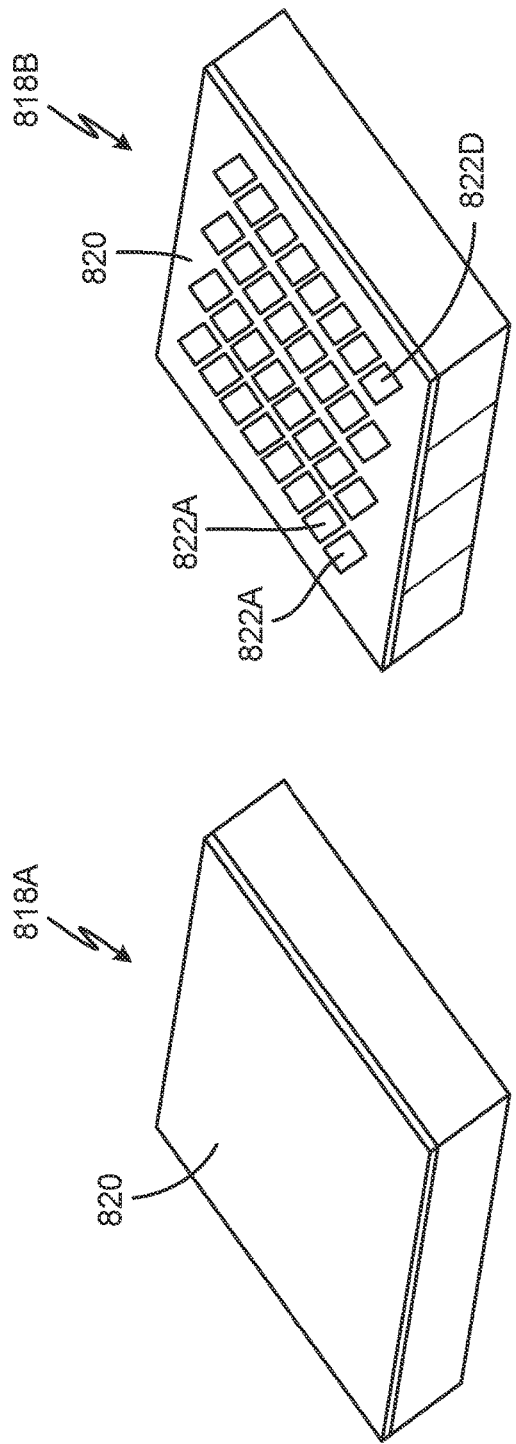
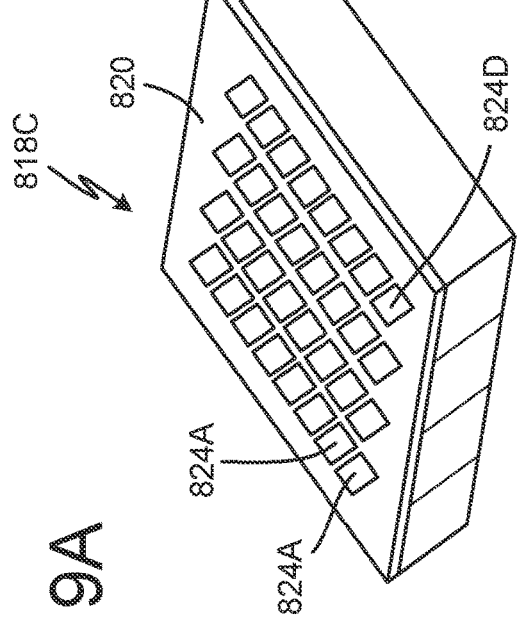
Fig. 9A  Fig. 9B  Fig. 9C

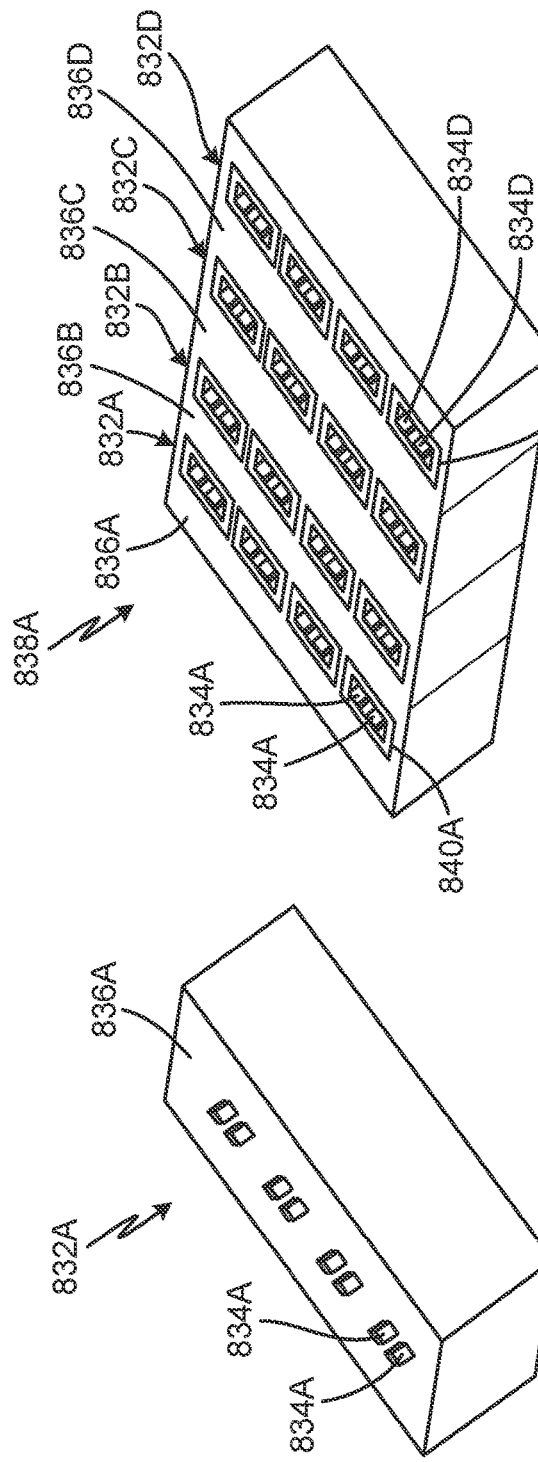
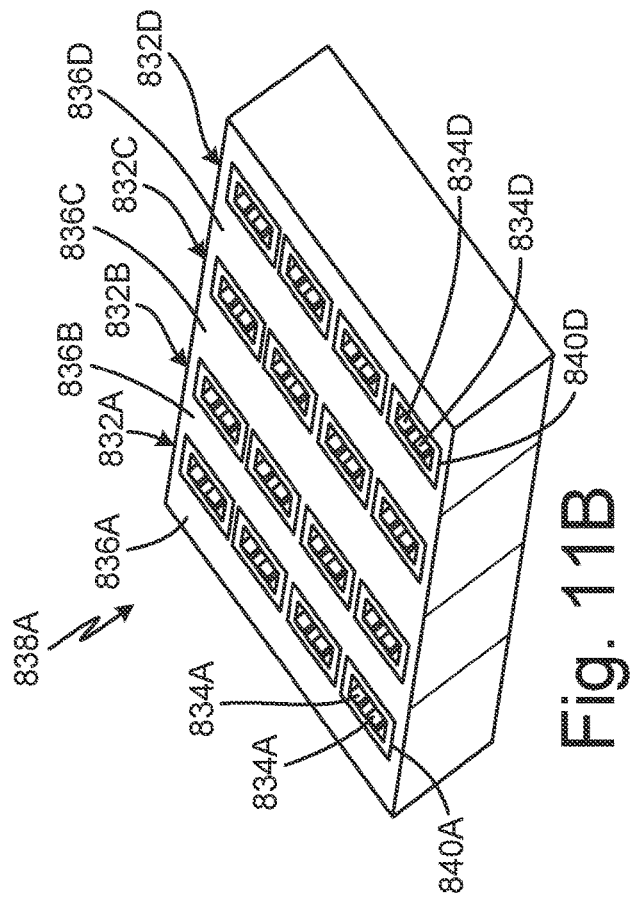
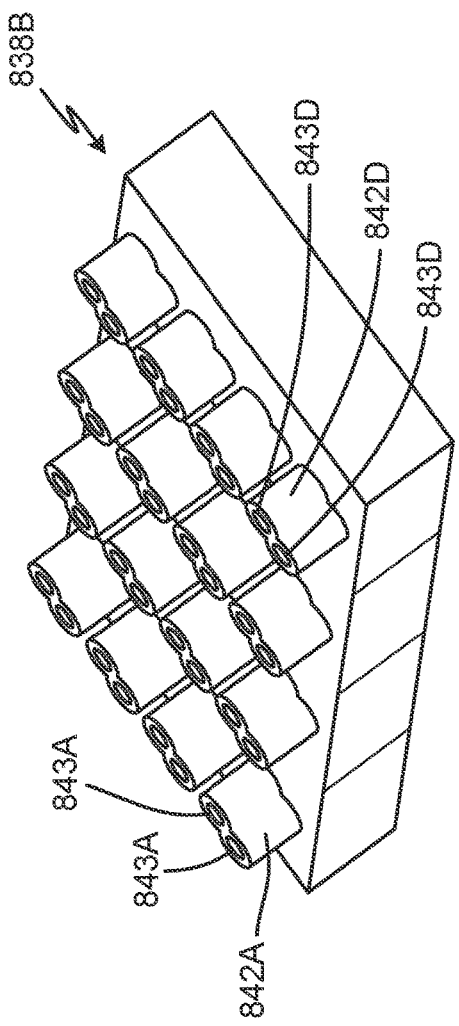

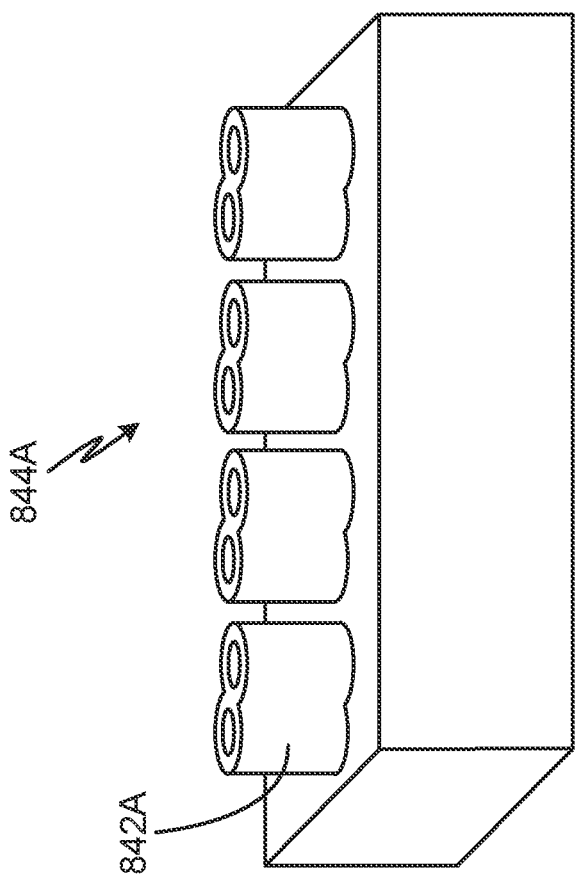
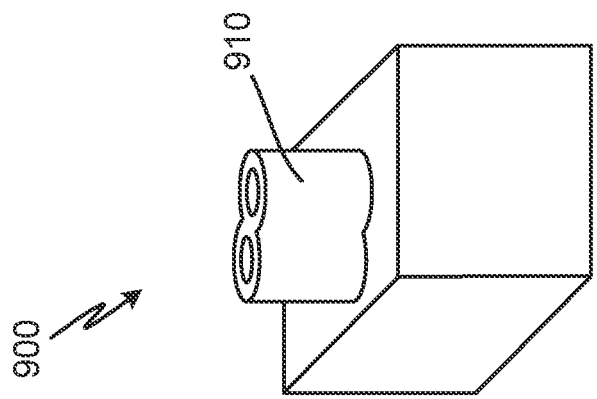

MEMS STRAIN GAUGE PRESSURE SENSOR WITH MECHANICAL SYMMETRIES

BACKGROUND

This disclosure relates generally to pressure sensors, and more specifically to microelectromechanical system (MEMS) strain gauge pressure sensors.

MEMS pressure sensors are configured to measure the pressure of a fluid. Pressure sensors can be absolute pressure sensors that measure a pressure of a first fluid compared to a reference pressure (typically a vacuum). Pressure sensors can also be differential pressure sensors that measure a difference in pressure between a first fluid and a second fluid. Pressure sensors can measure pressure in a variety of ways. For example, a MEMS pressure sensor can include a diaphragm that deforms or deflects based on the pressure of a first fluid and/or a second fluid, and a piezoresistive strain gauge sensor on the diaphragm can measure the strain in the diaphragm caused by the deformation of the diaphragm. Pressure sensors can have a first cavity on a first side of the diaphragm and a second cavity on a second side of the diaphragm. In a differential pressure sensor, the first and second cavities can be connected to two separate fluid sources.

An integrated mechanical structure is required to support the pressure sensor diaphragm. Supporting structures can also function as packaging for pressure sensors, and differential pressure sensors can have more complex structures. Strain gauge pressure sensors are very sensitive to mechanical stress generated by supporting structures (i.e., packaging). Mechanical stress from the supporting structures can be transferred to the pressure sensor and cause the diaphragm to deflect. This will cause an erroneous output in the pressure sensor, as the deflection of the diaphragm is not being caused by pressure differences but rather by stress in the system.

SUMMARY

In one example, a microelectromechanical system (MEMS) strain gauge pressure sensor includes a top wafer stack having a top surface and a first cavity that is configured to receive a first fluid at a first pressure, a backing wafer having a bottom surface opposite the top surface of the top wafer stack; a diaphragm wafer positioned between the top wafer stack and the backing wafer and having a second cavity that is configured to receive a second fluid at a second pressure, and a pedestal connected laterally to the top wafer stack, the backing wafer, and the diaphragm wafer. The diaphragm wafer includes a diaphragm extending between the first cavity and the second cavity and configured to deflect from the first pressure and/or the second pressure, and a resistor positioned on the diaphragm to sense a deflection of the diaphragm. The MEMS strain gauge pressure sensor has a central axis that is parallel to the top surface and the bottom surface such that the MEMS strain gauge pressure sensor has mechanical symmetries about the central axis.

In another example, a method of fabricating a microelectromechanical system (MEMS) strain gauge pressure includes forming a top wafer stack having a top surface and defining a first cavity, forming a backing wafer having a bottom surface, and forming a diaphragm wafer defining a second cavity. The diaphragm wafer includes a diaphragm configured to deflect from a difference in pressure, and a resistor positioned on the diaphragm to sense a deflection of the diaphragm. The method further includes bonding the top wafer stack to the diaphragm wafer and bonding the diaphragm wafer to the backing wafer to form a full wafer stack, such that the diaphragm wafer is positioned between the top wafer stack and the backing wafer, the diaphragm is positioned between the first cavity and the second cavity, and the top surface is opposite the bottom surface. The method further includes attaching a pedestal laterally to the top wafer stack, the backing wafer, and the diaphragm wafer. The MEMS strain gauge pressure sensor has a central axis that is parallel to the top surface and the bottom surface such that the MEMS strain gauge pressure sensor has mechanical symmetries about the central axis.

BRIEF DESCRIPTION OF THE DRAWINGS

FIGS. 3A-3F are schematic cross-sectional side views illustrating steps for fabricating a top wafer stack.

FIGS. 4A-4G are schematic cross-sectional side views illustrating steps for fabricating a diaphragm wafer.

FIG. 4H is a schematic isometric view showing the diaphragm wafer.

FIG. 6A is an exploded schematic cross-sectional side view showing the full wafer stack.

FIG. 6B is a schematic cross-sectional side view of the assembled full wafer stack.

FIGS. 8A-8C are schematic isometric views illustrating steps for dicing the full wafer stack into bars and assembling a sheet.

FIGS. 9A-9C are schematic isometric views illustrating steps for connecting contact pads to the sheet.

FIGS. 11A-11C are schematic isometric views illustrating steps for attaching pedestals to the sheet.

FIGS. 12A-12B are schematic isometric views illustrating steps for further dicing the sheet into individual sensors.

DETAILED DESCRIPTION

In general, the present disclosure describes a microelectromechanical system (MEMS) strain gauge pressure sensor with mechanical symmetries and a side-attached pedestal. The mechanical symmetries and positioning of the pedestal can alleviate unbalanced stresses within the pressure sensor and improve sensing accuracy. Additionally, the pressure sensor can have a simple and streamlined construction. The MEMS strain gauge pressure sensor disclosed herein, and a corresponding method of fabrication, are described below with reference to FIGS. 1-12B.

Figure 1:
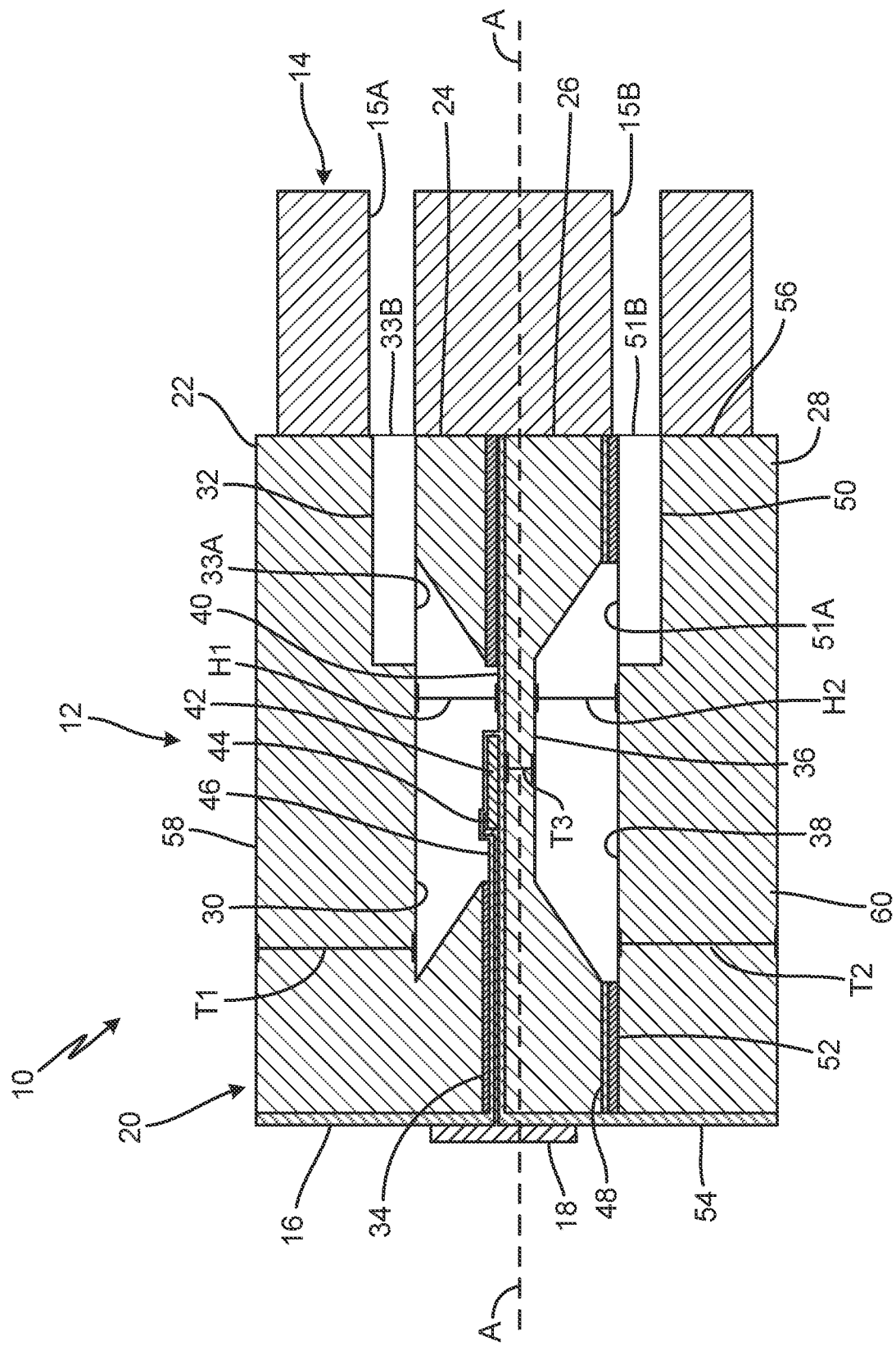
FIG. 1 is a schematic cross-sectional side view of a MEMS strain gauge pressure sensor.

FIG. 1 is a schematic cross-sectional side view of MEMS strain gauge pressure sensor 10. Pressure sensor 10 includes full wafer stack 12, pedestal 14 (including ports 15A and 15B), insulation layer 16, and contact pad 18. Full wafer stack 12 includes top wafer stack 20 (including first topping wafer 22 and second topping wafer 24), diaphragm wafer 26, and backing wafer 28. Top wafer stack 20 also includes first cavity 30, first channel 32 (including openings 33A and 33B), and bonding material (e.g., glass frit) 34. Diaphragm wafer 26 includes diaphragm 36, second cavity 38, first insulation layer 40, resistor 42, contact metal layer 44, second insulation layer 46, and third insulation layer 48. Backing wafer 28 includes second channel 50 (including openings 51A and 51B) and bonding material (e.g., glass frit) 52. Pressure sensor 10 has first side 54, second side 56, top side 58, and bottom side 60. Also labeled in FIG. 1 are central axis A, first topping wafer thickness T1, backing wafer thickness T2, and diaphragm thickness T3, first cavity height H1, and second cavity height H2.

Full wafer stack 12 includes top wafer stack 20, diaphragm wafer 26, and backing wafer 28. Diaphragm wafer 26 is positioned between top wafer stack 20 and backing wafer 28 within full wafer stack 12. Each of top wafer stack 20, diaphragm wafer 26, and backing wafer 28 can be parallel to each other. In an exemplary embodiment, top wafer stack 20, diaphragm wafer 26, and backing wafer 28 are square when viewed from the top (i.e., from a perspective that is perpendicular to that of FIG. 1). In other exemplary embodiments, top wafer stack 20, diaphragm wafer 26, and backing wafer 28 have rounded corners, or can be round, when viewed from the top. Top wafer stack 20 includes first topping wafer 22 and second topping wafer 24. First topping wafer 22 defines top side 58 (i.e., a top surface) of pressure sensor 10, backing wafer 28 defines bottom side 60 (i.e., a bottom surface) of pressure sensor 10, and top side 58 is opposite bottom side 60. First topping wafer 22, second topping wafer 24, diaphragm wafer 26, and backing wafer 28 each extend from first side 54 to second side 56 in pressure sensor 10. Each of first topping wafer 22, second topping wafer 24, diaphragm wafer 26, and backing wafer 28 can be silicon wafers.

First topping wafer 22 is bonded to second topping wafer 24. For example, first topping wafer 22 can be bonded to second topping wafer 24 by silicon wafer fusion bonding to form top wafer stack 20. Top wafer stack 20 is bonded at second topping wafer 24 to diaphragm wafer 26. Specifically, bonding material 34 is between second topping wafer 24 and diaphragm wafer 26 to form a bond. In an exemplary embodiment, bonding material 34 is glass frit, such that second topping wafer 24 and diaphragm wafer 26 are bonded by glass frit bonding. In other exemplary embodiments, bonding material 34 can be any suitable bonding material, including metal, polymer, etc. Diaphragm wafer 26 is bonded on an opposite side to backing wafer 28. Specifically, bonding material 52 is between diaphragm wafer 26 and backing wafer 28 to form a bond. In an exemplary embodiment, bonding material 52 is glass frit, such that diaphragm wafer 26 and backing wafer 28 are bonded by glass frit bonding. In other exemplary embodiments, bonding material 52 can be any suitable bonding material, including metal, polymer, etc. The thickness of bonding material 34, 52 can be negligible (i.e., the thickness of bonding material 34, 52 can have no substantial effect on the mechanics of pressure sensor 10).

Diaphragm 36 is a portion of diaphragm wafer 26 that extends between first cavity 30 and second cavity 38. Diaphragm 36 has diaphragm thickness T3, as indicated in FIG. 1. Diaphragm thickness T3 and an area of diaphragm 36 can define characteristics of pressure sensor performance (e.g., range and accuracy). First cavity 30 is a void formed within top wafer stack 20. First topping wafer 22, second topping wafer 24, bonding material 34, and second insulation layer 46 on diaphragm 36 define boundaries of first cavity 30 when pressure sensor 10 is assembled. The thickness of bonding material 34 (e.g., glass frit) and second insulation layer 46 in defining the boundaries of first cavity 30 can be negligible, such that the boundaries of first cavity 30 are primarily defined by first topping wafer 22, second topping wafer 24, and diaphragm 36. Thus, under vacuum conditions (i.e., the condition shown in FIG. 1, without an applied system pressure), first topping wafer 22 is separated from diaphragm 36 by first cavity height H1. Second topping wafer 24 surrounds (i.e., forms a periphery of) first cavity 30. In the embodiment shown in FIG. 1, second topping wafer 24 has chamfered edges adjacent first cavity 30, such that first cavity 30 has a trapezoidal cross-sectional area. First cavity 30 can have a uniform height between the chamfered edges (e.g., as illustrated by first cavity height H1 in FIG. 1). In the embodiment shown in FIG. 1, the chamfered edges of second topping wafer 24 have an angle of approximately 54.7 degrees (as measured with respect to central axis A). In other embodiments, first cavity 30 can have a different cross-sectional shape.

Second cavity 38 is a void formed within diaphragm wafer 26. Diaphragm wafer 26 (including diaphragm 36), third insulation layer 48, bonding material 52, and backing wafer 28 define boundaries of second cavity 38 when pressure sensor 10 is assembled. The thickness of bonding material 52 (e.g., glass frit) and third insulation layer 48 in defining the boundaries of second cavity 38 can be negligible, such that the boundaries of second cavity 38 are primarily defined by diaphragm wafer 26 and backing wafer 28. Thus, under vacuum conditions (i.e., the condition shown in FIG. 1, without an applied system pressure), backing wafer 28 is separated from diaphragm 36 by second cavity height H2. Diaphragm wafer 26 surrounds (i.e., forms a periphery of) second cavity 38. In the embodiment shown in FIG. 1, diaphragm wafer 26 has chamfered edges adjacent second cavity 38, such that second cavity 38 has a trapezoidal cross-sectional area. Second cavity 38 can have a uniform height between the chamfered edges (e.g., as illustrated by second cavity height H2 in FIG. 1). In the embodiment shown in FIG. 1, second cavity height H2 is equal to first cavity height H1 under vacuum conditions and when a pressure of a first fluid in first cavity 30 is equal to a pressure of a second fluid in second cavity 38. In the embodiment shown in FIG. 1, the chamfered edges of diaphragm wafer 26 have an angle of approximately 54.7 degrees (as measured with respect to central axis A). In other embodiments, second cavity 38 can have a different cross-sectional shape.

Resistor 42 is positioned on diaphragm 36 (on first insulation layer 40, as shown in FIG. 1) such that resistor 42 is exposed to first cavity 30. Resistor 42 can be a polysilicon piezoresistor. The example of FIG. 1 shows a single resistor 42, but it should be understood that other embodiments can include multiple resistors 42 arranged on diaphragm 36. For example, four resistors 42 can be arranged on diaphragm 36 to form a Wheatstone bridge circuit. Contact metal layer 44 contacts resistor 42 and extends across a portion of first insulation layer 40 to connect to contact pad 18 at first side 54 of pressure sensor 10, forming an electrical via (i.e., a contact via). The number of contact pads 18 can correspond to the number of resistors 42.

First insulation layer 40 extends across diaphragm wafer 26 on a first side of diaphragm wafer 26 that is adjacent first cavity 30. As shown schematically in FIG. 1, second insulation layer 46 extends over portions of contact metal layer 44, resistor 42, and first insulation layer 40. Second insulation layer 46 contacts bonding material 34 of top wafer stack 20. Third insulation layer 48 is between diaphragm wafer 26 and bonding material 52 of backing wafer 28 on a second side of diaphragm wafer 26 that is adjacent second cavity 38.

First insulation layer 40, second insulation layer 42, and third insulation layer 48 can be any suitable insulation material.

Contact metal layer 44 extends between second topping wafer 24 and diaphragm wafer 26 to an exterior of pressure sensor 10 at first side 54. Insulation layer 16 extends across first side 58 of pressure sensor 10. Insulation layer 16 can be any suitable insulation material. Contact pad 18 is positioned on a portion of insulation layer 16 over an end of contact metal layer 44. Contact pad 18 is an electrical contact material. Contact pad 18 extends through insulation layer 16 to contact metal layer 44. Contact pad 18 forms an electrical connection with contact metal layer 44 and thereby with resistor 42.

First channel 32 is a channel or trench in first topping wafer 22. First channel 32 extends between opening 33A and opening 33B. Opening 33A is an opening into first channel 32 from first cavity 30. Opening 33B is an opening into first channel 32 from an exterior of pressure sensor 10 at second side 56. Thus, first channel 32 connects first cavity 30 to an exterior of pressure sensor 10. First channel 32 can have a rectangular cross-sectional area, as indicated by dashed lines in FIG. 1. In other embodiments, first channel 32 can have any suitable cross-sectional shape.

In some embodiments, second channel 50 is a channel or trench in backing wafer 28. Embodiments of pressure sensor 10 including second channel 50 can be differential pressure sensors (e.g., as shown in FIG. 1). Embodiments of pressure sensor 10 that do not include second channel 50 (or that include a sealed or closed second channel 50) can be absolute pressure sensors (not shown). Second channel 50 extends between opening 51A and opening 51B. Opening 51A is an opening into second channel 50 from second cavity 38. Opening 51B is an opening into second channel 50 from an exterior of pressure sensor 10 at second side 56. Thus, second channel 50 connects second cavity 38 to an exterior of pressure sensor 10. Second channel 50 can have a rectangular cross-sectional area, as indicated by dashed lines in FIG. 1. In other embodiments, second channel 50 can have any suitable cross-sectional shape.

Pedestal 14 is connected to second side 56 of pressure sensor 10 and extends laterally from full wafer stack 12. Pedestal 14 is a support or connecting structure of pressure sensor 10 for connecting pressure sensor 10 to other components in a sensing system. Respective portions of pedestal 14 can be bonded to first topping wafer 22, second topping wafer 24, diaphragm wafer 26, and backing wafer 28. Pedestal 14 can be a solid structure consisting of two joined cylindrical portions such that pedestal 14 has a lemniscate-like shape when viewed from the side (i.e., from a perspective that is perpendicular to that of FIG. 1). Ports 15A and 15B extend through pedestal 14 to second side 56 of pressure sensor 10. Ports 15A and 15B can communicate system pressures to an interior of pressure sensor 10. Specifically, port 15A is aligned with opening 33B of first channel 32 to provide a first fluid to first cavity 30. Port 15B is aligned with opening 51B of second channel 50 to provide a second fluid to second cavity 38. In an exemplary embodiment, pedestal 14 is a glass material that is bonded to full wafer stack 12 at second side 56.

Pressure sensor 10 has mechanical symmetries about central axis A. Specifically, first topping wafer thickness T1 can be equal to backing wafer thickness T2. Similarly, first cavity height H1 and second cavity height H2 can be equal under vacuum conditions (i.e., where there is no deflection of diaphragm 36) and when a pressure of a first fluid in first cavity 30 is equal to a pressure of a second fluid in second cavity 38. Diaphragm 36 is symmetric about central axis A. In other words, diaphragm thickness T3 is divided in half by central axis A. Pedestal 14 is also symmetric about central axis A. As shown in FIG. 1, pedestal 14 has symmetric attachment to first topping wafer 22 and backing wafer 28 and to second topping wafer 24 and diaphragm wafer 26. Minor asymmetries caused by, e.g., resistor 42, contact metal layer 44, first channel 32, etc. has a negligible effect on the mechanics of pressure sensor 10 (i.e., pressure sensor 10 is mechanically symmetrical).

In general, the physical dimensions of pressure sensor 10 can be different in various embodiments. More specifically, cavity size (e.g., an area of first cavity 30 and an area of second cavity 38) and diaphragm thickness (e.g., diaphragm thickness T3) can be proportional based on the pressure and desired deflection characteristics of pressure sensor 10.

In operation, pressure sensor 10 can measure system pressures. In a differential pressure sensor embodiment (FIG. 1), first cavity 30 receives a first fluid (e.g., a gas) at a first applied pressure via fluid communication with first channel 32. Second cavity 38 receives a second fluid (e.g., a gas) at a second applied pressure via fluid communication with second channel 50. A difference between the first applied pressure and the second applied pressure causes diaphragm 36 to deflect. Deflection of diaphragm 36 in turn causes a piezoresistive change in resistor 42. Resistor 42 thereby senses a deflection of diaphragm 36. An electrical circuit (not shown) applied to contact pad 18 can be configured to measure this change, thereby providing a representation of the value of the applied system pressures (i.e., the difference between the first applied pressure and the second applied pressure). Pressure sensor 10 functions similarly in an absolute pressure sensor embodiment (not shown), except that second cavity 38 is a vacuum, so there is no second applied pressure, and the measured piezoresistive change in resistor 42 therefore provides a representation of an absolute (i.e., atmospheric) pressure, rather than a difference between two applied system pressures.

The mechanical symmetry of pressure sensor 10 as described above can prevent unbalanced stress from occurring within pressure sensor 10 (e.g., between first topping wafer 22 and backing wafer 28) and altering the deflection of diaphragm 36. Additionally, when different materials are used for the wafers (e.g., silicon) and pedestal 14 (e.g., glass), any generated stress becomes common mode and has a minimal impact on diaphragm 36.

Fabrication of a MEMS strain gauge pressure sensor (e.g., pressure sensor 10) will be described with reference to FIGS. 2-12B. In this section, sequential iterations of work in process (WIP) features will be indicated with sequential lettering (e.g., "300A," "300B," etc.), and WIP features may be referred to generally by the shared reference number.

Figure 2:
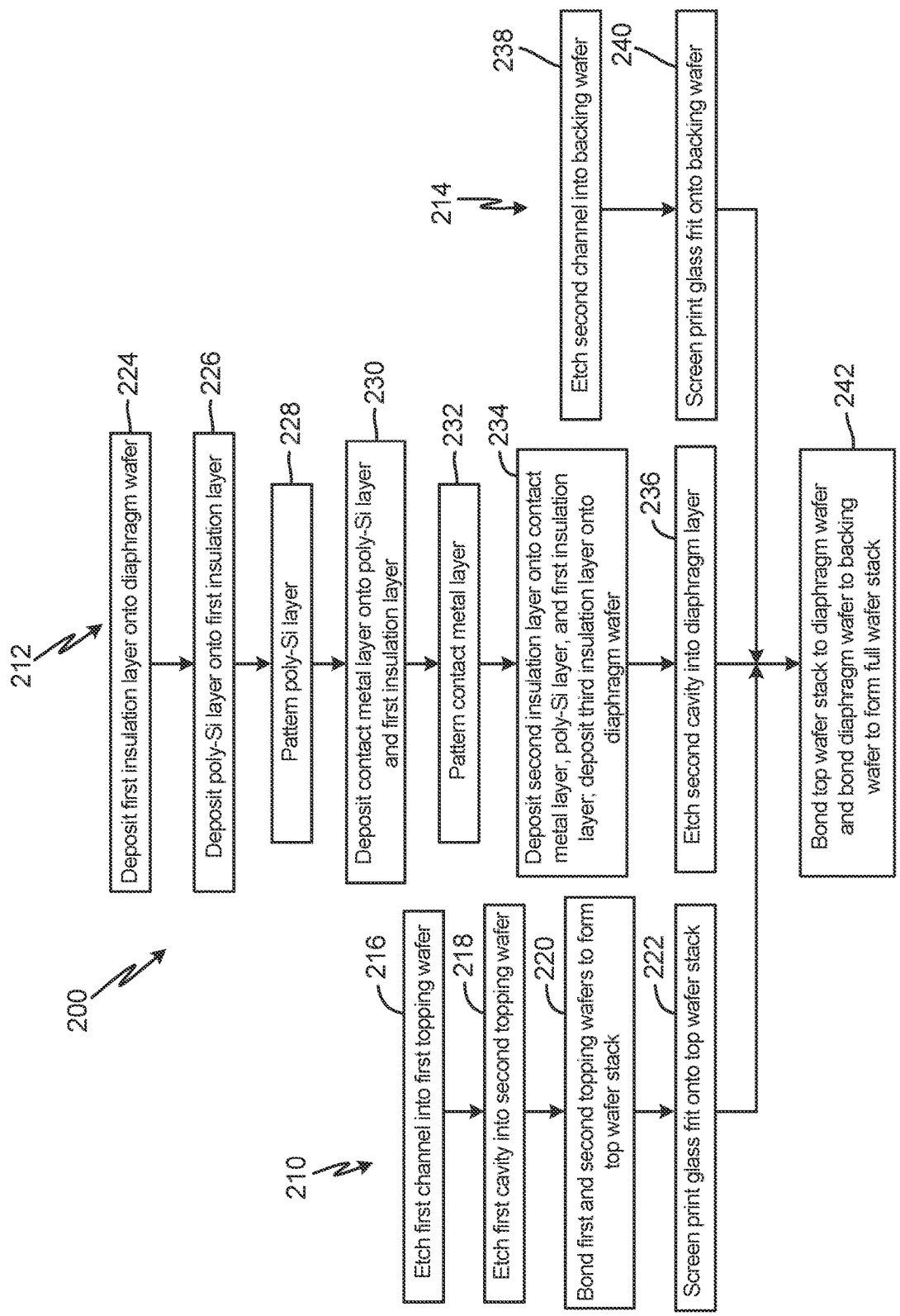
FIG. 2 is a process flow diagram showing steps for fabricating a full wafer stack.

For ease of discussion, FIGS. 2-6B will be described together. FIG. 2 is a process flow diagram showing steps of process 200 for fabricating a full wafer stack (e.g., for MEMS strain gauge pressure sensor 10 shown in FIG. 1). Process 200 includes sub-processes 210, 212, and 214. Sub-processes 210, 212, and 214 will be described in turn below.

Sub-process 210 of process 200 will be described with reference to FIGS. 3A-3F below. FIGS. 3A-3F are schematic cross-sectional side views illustrating steps 216-222 of sub-process 210 of FIG. 2 for fabricating top wafer stack WIP 300. Top wafer stack WIP 300 and its component parts are substantially similar in structure to top wafer stack 12 and its component parts (as described above with reference to FIG. 1), except where in-process differences are noted. FIG. 3A shows first topping wafer WIP 310. At step 216 of sub-process 210, first channel 312 is etched into first topping wafer WIP 310 to form first topping wafer WIP 310A (shown in FIG. 3B). First channel 312 is etched into bonding surface 314 away from a periphery of first topping wafer WIP 310A. FIG. 3C shows second topping wafer WIP 316 with bonding surface 318. At step 218, second topping wafer WIP 316 is etched to form chamfered edges 320 of second topping wafer WIP 316A (shown in FIG. 3D). In an exemplary embodiment, etching in step 218 can be a full-thickness KOH etching, and chamfered edges 320 will have angles of approximately 54.7 degrees. In other embodiments, etching can be other "dry" or "wet" etch processes known in the art and result in different angles of chamfered edges 320 or a different profile without chamfered edges 320.

At step 220, first topping wafer WIP 310A (shown in FIG. 3B) and second topping wafer WIP 316A (shown in FIG. 3D) are bonded along bonding surfaces 314 and 318 to form top wafer stack WIP 300 (shown in FIG. 3E). In an exemplary embodiment, bonding between first topping wafer WIP 310A and second topping wafer WIP 316A can be silicon fusion bonding. Bonding between first topping wafer WIP 310A and second topping wafer WIP 316A defines the periphery of first cavity 322 within top wafer stack WIP 300. Moreover, this bonding seals off a portion of first channel 312, leaving an opening into first cavity 322. At step 222, glass frit 324 (or other suitable bonding material, such as metal, polymer, etc.) is screen printed onto top wafer stack WIP 300 at second topping wafer WIP 316 (onto a side opposite bonding surface 318) to form top wafer stack WIP 300A (shown in FIG. 3F). Glass frit 324 surrounds first cavity 322. FIG. 3F shows assembled top wafer stack WIP 300A.

Figure 4A:
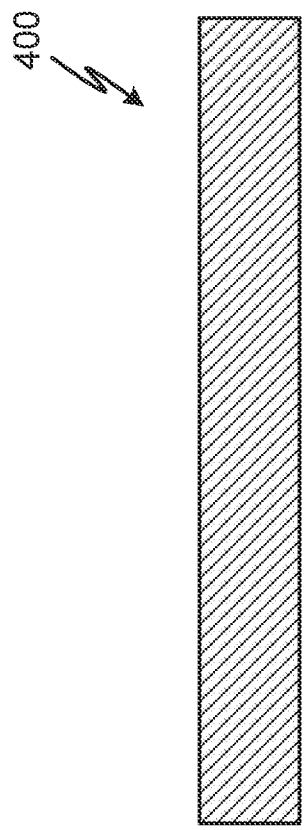
Figure 4B:
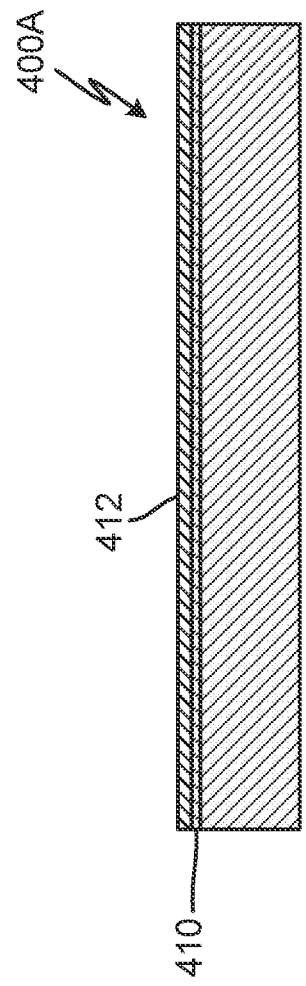
Figure 4C:
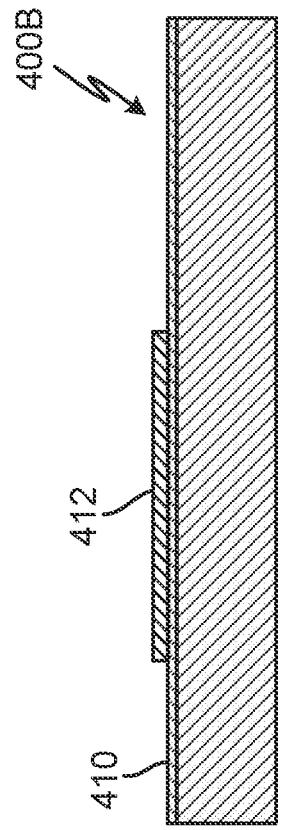

Sub-process 212 of process 200 will be described with reference to FIGS. 4A-4H below. FIGS. 4A-4G are schematic cross-sectional side views illustrating steps 224-236 of sub-process 212 of FIG. 2 for fabricating diaphragm wafer WIP 400. FIG. 4H is a schematic isometric view showing diaphragm wafer WIP 400. Diaphragm wafer WIP 400 and its component parts are substantially similar in structure to diaphragm wafer 26 and its component parts (as described above with reference to FIG. 1), except where in-process differences are noted. FIG. 4A shows diaphragm wafer WIP 400. At step 224 of sub-process 212, first insulation layer 410 is deposited onto diaphragm wafer WIP 400, and at step 226, polysilicon (poly-Si) layer 412 is deposited onto first insulation layer 410 to form diaphragm wafer WIP 400A (shown in FIG. 4B). At step 228, polysilicon layer 412 is patterned to expose a portion of first insulation layer 410 (shown in FIG. 4C). This patterning forms polysilicon layer 412 into individual resistors (e.g., resistor 42 of FIG. 1) positioned on the surface of diaphragm wafer WIP 400B. At step 230, contact metal layer 414 is deposited onto polysilicon layer 412 and an exposed portion of first insulation layer 410 to form diaphragm wafer WIP 400C (shown in FIG. 4D). At step 232, contact metal layer 414 is patterned to expose a portion of polysilicon layer 412 and first insulation layer 410 (shown in FIG. 4E). As shown in FIG. 4E, patterned contact metal layer 414 extends from the periphery of diaphragm wafer WIP 400D inwards to contact polysilicon layer 412. A portion of patterned contact metal layer 414 can remain on polysilicon layer 412. At step 234, second insulation layer 416 is deposited onto contact metal layer 414, an exposed portion of polysilicon layer 412, and an exposed portion of first insulation layer 410 (shown in FIG. 4F). Additionally, third insulation layer 418 is deposited on etching side 420 of diaphragm wafer WIP 400E, opposite second insulation layer 416 (shown in FIG. 4F).

At step 236, diaphragm wafer WIP 400E is etched on etching side 420 to form diaphragm 422 between chamfered edges 424 of diaphragm wafer WIP 400F (FIG. 4G). In an exemplary embodiment, etching in step 236 can be KOH etching, and chamfered edges 424 will have angles of approximately 54.7 degrees. In other embodiments, etching can be other "dry" or "wet" etch processes known in the art and result in different angles of chamfered edges 424 or a different profile without chamfered edges 424. Moreover, etching in step 236 defines the periphery of second cavity 426 within diaphragm wafer WIP 400F. As shown in FIG. 4G, a portion of third insulation layer 418 remains surrounding second cavity 426. FIGS. 4G and 4H show assembled diaphragm wafer WIP 400F.

Figure 5A:
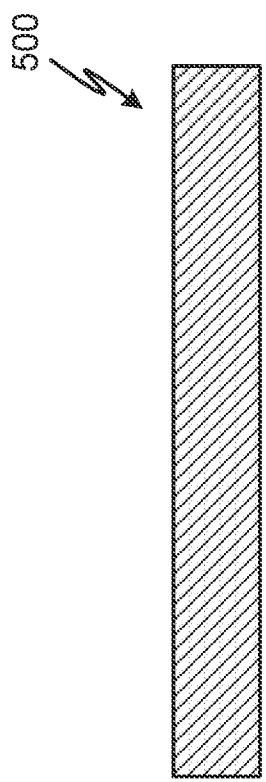
FIGS. 5A-5C are schematic cross-sectional side views illustrating steps for fabricating a backing wafer.
Figure 5B:
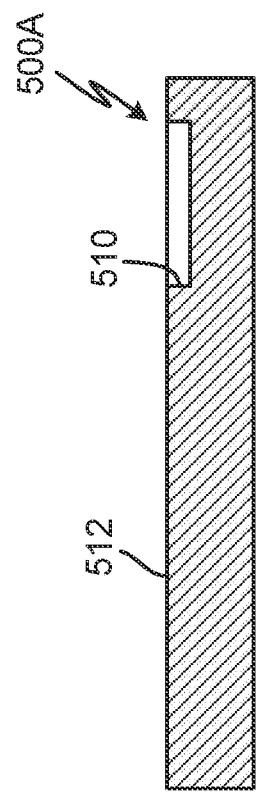
Figure 5C:
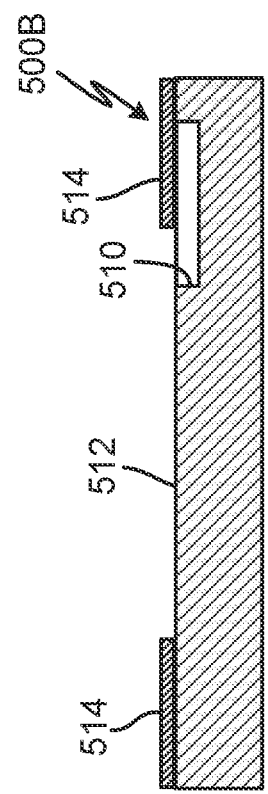

Sub-process 214 of process 200 will be described with reference to FIGS. 5A-5C below. FIGS. 5A-5C are schematic cross-sectional side views illustrating steps 238-240 of sub-process 214 of FIG. 2 for fabricating backing wafer WIP 500. Backing wafer WIP 500 and its component parts are substantially similar in structure to backing wafer 28 and its component parts (as described above with reference to FIG. 1), except where in-process differences are noted. FIG. 5A shows backing wafer WIP 500. At step 238 of sub-process 214, second channel 510 is etched into backing wafer WIP 500 to form backing wafer WIP 500A (shown in FIG. 5B). Backing wafer WIP 500A is a differential pressure sensor embodiment. In absolute pressure sensor embodiments, second channel 510 is not etched into backing wafer WIP 500 (not shown). Second channel 510 is etched into bonding surface 512 away from a periphery of backing wafer WIP 500A. At step 240, glass frit 514 (or other suitable bonding material, such as metal, polymer, etc.) is screen printed onto bonding surface 512 around the periphery of backing wafer WIP 500B (shown in FIG. 5C). As shown schematically in FIG. 5C, glass frit 514 surrounds a portion of second channel 510. FIG. 5C shows assembled backing wafer WIP 500B.

Step 242 of process 200 with be described with reference to FIGS. 6A-6B below. FIG. 6A is an exploded schematic cross-sectional side view showing full wafer stack WIP 600. FIG. 6B is a schematic cross-sectional side view of assembled full wafer stack WIP 600. At step 242 of process 200, assembled top wafer stack WIP 300 is bonded to assembled diaphragm wafer WIP 400, and assembled diaphragm wafer WIP 400 is bonded to assembled backing wafer WIP 500 to form full wafer stack WIP 600. In an exemplary embodiment, top wafer stack WIP 300 is bonded to diaphragm wafer WIP 400 by glass frit bonding at glass frit 324, and diaphragm wafer WIP 400 is bonded to backing wafer WIP 500 by glass frit bonding at glass frit 514. This bonding seals off a portion of second channel 510, leaving an opening into second cavity 426. In an absolute pressure sensor embodiment, diaphragm wafer WIP 400 is bonded to backing wafer WIP 500 under vacuum conditions and second channel 510 is not present or is filled in. Bonding in step 242 also seals first cavity 322 and second cavity 426. First cavity 322 and second cavity 426 can remain sealed (i.e., under vacuum conditions) until a dicing process, as will be described in greater detail below.

Figure 7:
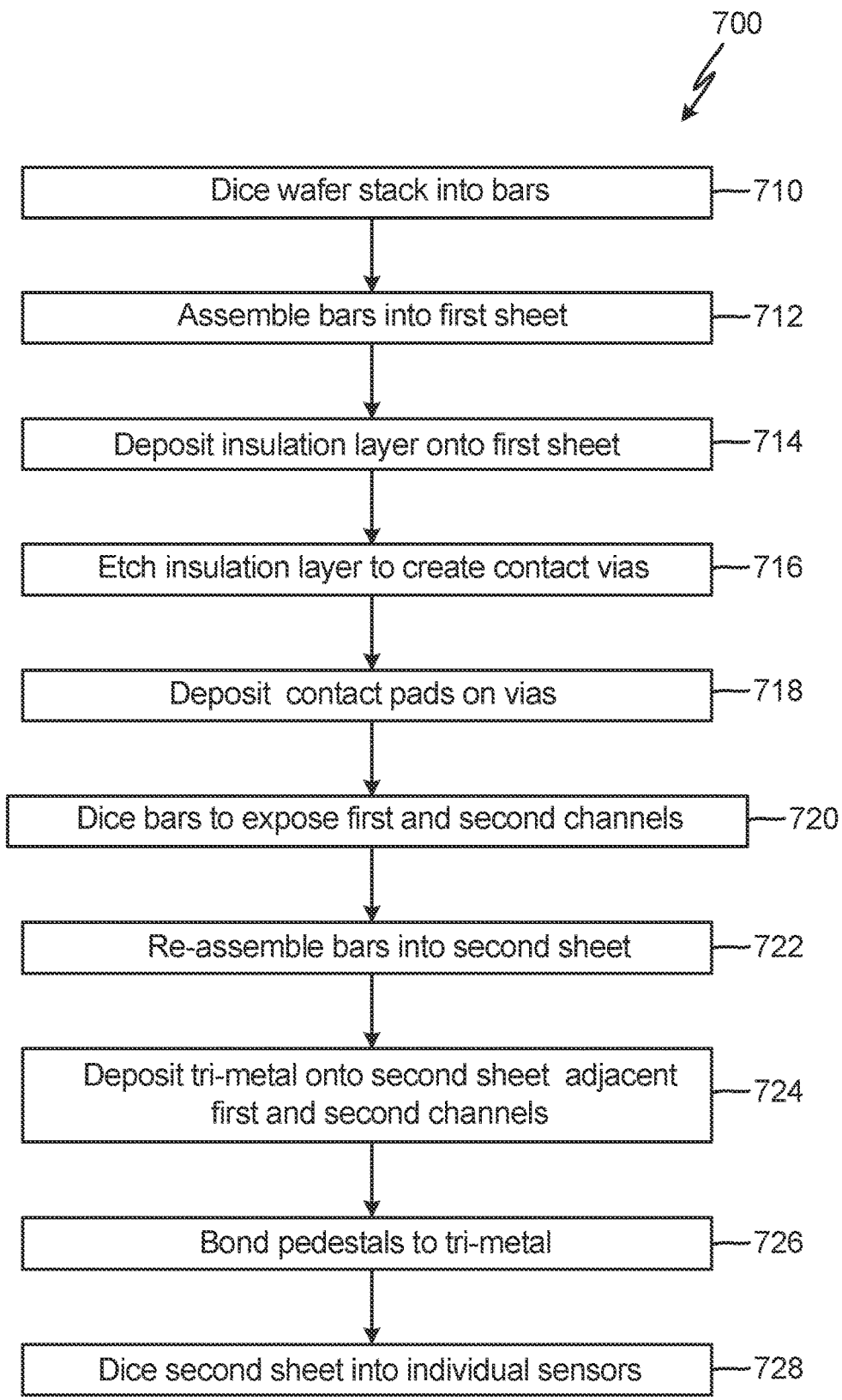
FIG. 7 is a process flow diagram showing steps for dicing the full wafer stack and assembling individual sensors.

For ease of discussion, FIGS. 7-12B will be described together. FIG. 7 is a process flow diagram showing steps 710-728 of process 700 for dicing a full wafer stack WIP (e.g., full wafer stack WIP 600 of FIG. 6B) and assembling individual sensors.

FIGS. 8A-8C are schematic isometric views illustrating steps for dicing full wafer stack WIP 800 into bars and assembling a sheet. Full wafer stack WIP 800 and its component parts are substantially similar in structure to full wafer stack WIP 600 and its component parts (as described above with reference to FIGS. 2-6B), except additional process steps will be described. Full wafer stack WIP 800 is an intermediate wafer stack for forming individual pressure sensors having cross sections as described above with respect to FIG. 1. Shown in FIG. 8A are dicing lines 810A-810H for dicing full wafer stack WIP 800. At step 710 of process 700, full wafer stack WIP 800 is diced perpendicularly along dicing lines 810A-810H into individual bars 812A-812H. FIG. 8B shows a single bar 812A for simplicity. In the embodiment shown in FIG. 8A, full wafer stack WIP 800 will be diced along eight dicing lines 810A-810H to form eight individual bars 812A-812H. In some examples, full wafer stack WIP 800 can be diced into 10 bars and include nine dicing lines. In other examples, full wafer stack WIP 800 can be diced into any suitable number of bars and include any suitable number of dicing lines, depending on the overall dimensions of full wafer stack WIP 800. Ends of contact metal layers 814A-814H are exposed on corresponding first sides 816A-816H of bars 812A-812H after full wafer stack WIP 800 is diced. At step 712, bars 812A-812D are arranged adjacent to one another to form sheet WIP 818 by rotating each bar 812A-812D so first sides 816A-816D face the same direction and the exposed ends of contact metal layers 814A-814D are aligned (shown in FIG. 8C). Four individual bars 812A-812D are arranged to form sheet WIP 818 in the embodiment shown in FIG. 8C, but any suitable number of individual bars can be arranged to form a sheet in alternate embodiments. Production parameters can determine a suitable number of bars 812A-812N to be aligned in sheet WIP 818.

FIGS. 9A-9C are schematic isometric views illustrating steps for connecting contact pads to sheet WIP 818. At step 714 of process 700, insulation layer 820 is deposited onto sheet WIP 818 at first sides 816A-816D to form sheet WIP 818A (shown in FIG. 9A). At step 716, insulation layer 820 is etched to expose ends of contact metal layers 814A-814D and create corresponding contact vias 822A-822D in sheet WIP 818B (shown in FIG. 9B). Contact vias 822A-822D are holes extending through insulation layer 820 to the exposed ends of contact metal layers 814A-814D. At step 718, contact pads 824A-824D are deposited on corresponding contact vias 822A-822D (shown in FIG. 9C). Contact pads 824A-824D can be deposited by a shadow masking process so that contact pads 824A-824D entirely cover contact vias 822A-822D but so portions of insulation layer 820 remain exposed on sheet WIP 818C.

Figure 10:
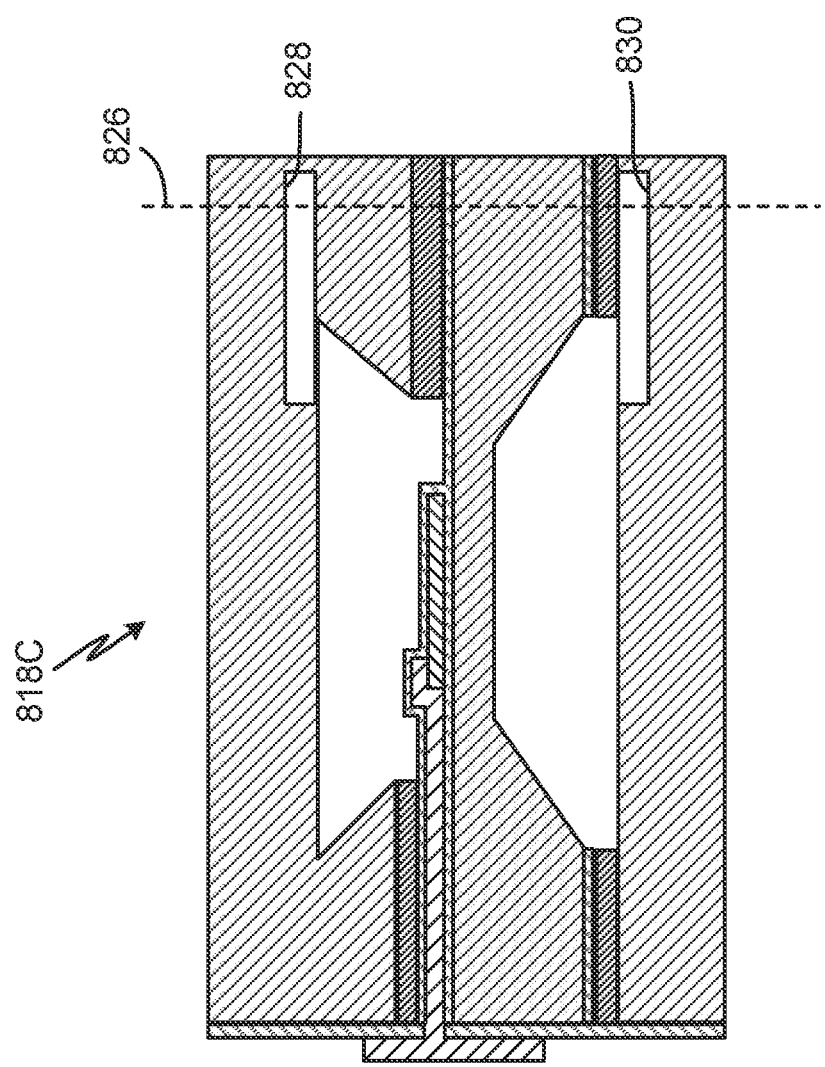
FIG. 10 is a partial schematic cross-sectional view of the sheet showing a dicing location.

FIG. 10 is a partial schematic cross-sectional view of sheet WIP 818C showing dicing location 826. FIGS. 11A-11C are schematic isometric views illustrating steps for attaching pedestals to a sheet. At step 720 of process 700, sheet WIP 818C is diced along dicing line 826 (shown in FIG. 10). In an exemplary embodiment, the dicing process of step 720 is a laser dicing process. Dicing line 826 extends through first channel 828 and second channel 830 (e.g., first channel 312 of FIG. 3B and second channel 510 of FIG. 5B). Thus, first channel 828 and second channel 830 are unsealed by dicing. Sheet WIP 818C can be re-separated into individual bars 832A-832D by dicing (not shown). FIG. 11A shows a single bar 832A for simplicity. After the dicing process of step 720, openings 834A-834D are exposed on corresponding second sides 836A-836D of bars 832A-832D. Pairs of openings 834A-834D (e.g., two of openings 834A, etc.) correspond to pairs of first channel 828 and second channel 830. At step 722, bars 832A-832D are re-arranged adjacent to one another to form sheet WIP 838 (not shown) by rotating each bar 832A-832D so second sides 836A-836D face the same direction and openings 834A-834D are aligned (e.g., as shown in FIG. 11B). As such, it should be understood that process steps occurring on sheet WIP 838 are occurring on the opposite side of the process steps for sheet WIP 818 described above, and sheet WIP 818 is effectively rotated 180 degrees. Thus, step 720 can be a separate dicing process from the dicing process described at step 710. As with sheet WIP 818, production parameters can determine a suitable number of bars 832A-832D to be aligned in sheet WIP 838. At step 724, bonding material (e.g., a metallic bonding material, a tri-metal material) 840A-840D is deposited onto sheet WIP 838 adjacent corresponding openings 834A-834D to form sheet WIP 838A (shown in FIG. 11B). As is shown schematically in FIG. 11B, each deposited metallic bonding material 840A-840D can surround corresponding pairs of openings 834A-834D. In some embodiments, metallic bonding material 840A-840D can be deposited 360 degrees around the edge of each opening 834A-834D. At step 726, pedestals 842A-842D are bonded to a corresponding metallic bonding material 840A-840D (shown in FIG. 11C). In this bonding process, metallic bonding material 840A-840D is heated and melted to form an intermediate bond between the silicon of sheet WIP 838B and each glass pedestal 842A-842D. Thus, openings 834A-834D are aligned with corresponding ports 843A-843D extending through pedestals 842A-842D.

FIGS. 12A-12B are schematic isometric views illustrating steps for further dicing sheet WIP 838B into individual sensors. Sheet WIP 838B can be re-separated into individual bars 844A-844D by dicing (not shown). FIG. 12A shows a single bar 844A for simplicity. At step 728, and as shown in FIG. 12B, individual bars 844A-844D are diced into individual sensors 900, each having pedestal 910 (e.g., one of pedestals 842A-842D). In some examples, each individual bar 844A-844D can be diced into 10 individual sensors. In other examples, individual bars 844A-844D can be diced into any suitable number of individual sensors, depending on the overall dimensions of sheet WIP 838B and each individual bar 844A-844D. The number of individual sensors 900 fabricated in process 700 can be optimized based on production parameters. Each individual sensor 900 has a cross section as shown in FIG. 1 (i.e., each individual sensor 900 is an embodiment of pressure sensor 10 of FIG. 1).

Pressure sensors, such as MEMS strain gauge pressure sensor 10 (shown in FIG. 1), have broad applications across numerous industries for measuring pressures with a high level of accuracy. Typical MEMS strain gauge pressure sensors have asymmetrically attached pedestals (e.g., attached to bottom side 60 of pressure sensor 10) or require extensive external packaging and tubing for communicating fluids into the internal cavities of the sensor. Asymmetrically attached pedestals cause unbalanced stress within the pressure sensor, for example, between a top and bottom wafer. Unbalanced stress causes a stress change in the diaphragm and can negatively impact the accuracy of the affected pressure sensor.

Pressure sensor 10 with mechanical symmetries—including full symmetry of pedestal 14, diaphragm thickness $T_3$, first topping wafer thickness $T_1$ and backing wafer thickness $T_2$, and first cavity height $H_1$ and second cavity height $H_2$, about central axis A—alleviates the unbalanced stresses that can be caused by asymmetrically attached pedestals in typical pressure sensors. The mechanical symmetries of pressure sensor 10 can thereby improve the accuracy of sensed pressure differences.

Because first channel 32 and/or second channel 50 both open on the same side (e.g., second side 56) of pressure sensor 10 to ports 15A and 15B of pedestal 14, pressure sensor 10 can have a simplified structure compared to typical MEMS strain gauge pressure sensors. In other words, having opening 33B of first channel 32 and opening 51B of second channel 50 both located on second side 56 and within ports 15A and 15B, respectively, of pedestal 14 can reduce the need for additional tubing or sensor packaging to connect to the openings.

Further, there is greater production congruency for fabricating differential and absolute pressure sensor embodiments of the pressure sensor disclosed herein. It is relatively easy to convert between the process (e.g., process 200) for fabricating a differential pressure sensor and the process for fabricating an absolute pressure sensor because a single step (e.g., step 238) is changed. Thus, the overall fabrication process for pressure sensors 10 can be streamlined.

Discussion of Possible Embodiments

The following are non-exclusive descriptions of possible embodiments of the present invention.

A microelectromechanical system (MEMS) strain gauge pressure sensor includes a top wafer stack having a top surface and a first cavity that is configured to receive a first fluid at a first pressure, a backing wafer having a bottom surface opposite the top surface of the top wafer stack; a diaphragm wafer positioned between the top wafer stack and the backing wafer and having a second cavity that is configured to receive a second fluid at a second pressure, and a pedestal connected laterally to the top wafer stack, the backing wafer, and the diaphragm wafer. The diaphragm wafer includes a diaphragm extending between the first cavity and the second cavity and configured to deflect from the first pressure and/or the second pressure, and a resistor positioned on the diaphragm to sense a deflection of the diaphragm. The MEMS strain gauge pressure sensor has a central axis that is parallel to the top surface and the bottom surface such that the MEMS strain gauge pressure sensor has mechanical symmetries about the central axis.

The MEMS strain gauge pressure sensor of the preceding paragraph can optionally include, additionally and/or alternatively, any one or more of the following features, configurations and/or additional components:

A height of the first cavity can be equal to a height of the second cavity under vacuum conditions.

The pedestal can be symmetric about the central axis.

The top wafer stack can include a first topping wafer and a second topping wafer.

A thickness of the first topping wafer can be equal to a thickness of the backing wafer.

The first topping wafer can include a first channel configured to communicate the first fluid to the first cavity, and the first channel can have a first opening adjacent the pedestal and a second opening at the first cavity.

The MEMS strain gauge pressure sensor can be an absolute pressure sensor.

The MEMS strain gauge pressure sensor can be a differential pressure sensor.

The backing wafer can include a second channel configured to deliver the second fluid to the second cavity, and the second channel can have a first opening adjacent the pedestal and a second opening at the second cavity.

The first topping wafer, the second topping wafer, the backing wafer, and the diaphragm wafer can be silicon wafers.

A method of fabricating a microelectromechanical system (MEMS) strain gauge pressure sensor can include forming a wafer stack. The wafer stack can include a first wafer, a second wafer on top of the first wafer, a third wafer on top of the second wafer, and a fourth wafer on top of the third wafer. The method can further include dicing the wafer stack into bars by dicing the wafer stack perpendicularly to the first, second, third, and fourth wafers to expose ends of contact metal layers. Each bar can include a first side with exposed ends of the contact metal layers, and a second side opposite the first side. The method can further include assembling the bars into a sheet with a first side corresponding to the first sides of the bars and a second side corresponding to the second sides of the bars, depositing an insulation layer onto the first side of the sheet, etching the insulation layer to create contact vias, depositing contact pads onto the contact vias, dicing the bars parallel to the second sides of the bars to expose channel openings, depositing a bonding material onto the bars adjacent the channel openings, bonding pedestals to the bonding material, and dicing the bars into individual MEMS strain gauge pressure sensors as described in the preceding paragraphs.

A method of fabricating a microelectromechanical system (MEMS) strain gauge pressure includes forming a top wafer stack having a top surface and defining a first cavity, forming a backing wafer having a bottom surface, and forming a diaphragm wafer defining a second cavity. The diaphragm wafer includes a diaphragm configured to deflect from a difference in pressure, and a resistor positioned on the diaphragm to sense a deflection of the diaphragm. The method further includes bonding the top wafer stack to the diaphragm wafer and bonding the diaphragm wafer to the backing wafer to form a full wafer stack, such that the diaphragm wafer is positioned between the top wafer stack and the backing wafer, the diaphragm is positioned between the first cavity and the second cavity, and the top surface is opposite the bottom surface. The method further includes attaching a pedestal laterally to the top wafer stack, the backing wafer, and the diaphragm wafer. The MEMS strain gauge pressure sensor has a central axis that is parallel to the top surface and the bottom surface such that the MEMS strain gauge pressure sensor has mechanical symmetries about the central axis.

The method of the preceding paragraph can optionally include, additionally and/or alternatively, any one or more of the following features, configurations operations, and/or additional components:

A height of the first cavity can be equal to a height of the second cavity under vacuum conditions, and attaching the pedestal laterally to the top wafer stack, the backing wafer, and the diaphragm wafer can include attaching the pedestal symmetrically about the central axis.

The top wafer stack can include a first topping wafer and a second topping wafer.

A thickness of the first topping wafer can be equal to a thickness of the backing wafer.

Forming the top wafer stack can include fusing the first topping wafer and the second topping wafer by fusion bonding.

Forming the top wafer stack can include etching the first cavity into the second topping wafer by KOH etching.

Forming the top wafer stack can include etching a first channel into the first topping wafer.

The first channel can have a first opening adjacent the pedestal and a second opening at the first cavity.

The MEMS strain gauge pressure sensor can be an absolute pressure sensor.

The MEMS strain gauge pressure sensor can be a differential pressure sensor.

Forming the backing wafer can include etching a second channel into the backing wafer.

The second channel can have a first opening adjacent the pedestal and a second opening at the second cavity.

Forming the diaphragm wafer can include depositing a first insulation layer on a first side of the diaphragm wafer; depositing a polysilicon layer on the first insulation layer; patterning the polysilicon layer; depositing a contact metal layer on the polysilicon layer and the first insulation layer; patterning the contact metal layer; depositing a second insulation layer on the contact metal layer, the polysilicon layer, and the first insulation layer; depositing a third insulation layer on a second side of the diaphragm wafer that is opposite the first side; and etching the second cavity into the second side of the diaphragm.

Bonding the top wafer stack to the diaphragm wafer and bonding the diaphragm wafer to the backing wafer each can include glass frit bonding.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A microelectromechanical system (MEMS) strain gauge pressure sensor comprising:
   a top wafer stack having a top surface and a first cavity that is configured to receive a first fluid at a first pressure;
   a backing wafer having a bottom surface opposite the top surface of the top wafer stack;
   a diaphragm wafer positioned between the top wafer stack and the backing wafer and having a second cavity that is configured to receive a second fluid at a second pressure, the diaphragm wafer comprising:
      a diaphragm extending between the first cavity and the second cavity and configured to deflect from the first pressure and/or the second pressure; and
      a resistor positioned on the diaphragm to sense a deflection of the diaphragm; and
   a pedestal connected laterally to the top wafer stack, the backing wafer, and the diaphragm wafer;
   wherein the MEMS strain gauge pressure sensor has a central axis that is parallel to the top surface and the bottom surface such that the MEMS strain gauge pressure sensor has mechanical symmetries about the central axis.

2. The MEMS strain gauge pressure sensor of claim 1, wherein a height of the first cavity is equal to a height of the second cavity under vacuum conditions.

3. The MEMS strain gauge pressure sensor of claim 1, wherein the pedestal is symmetric about the central axis.

4. The MEMS strain gauge pressure sensor of claim 1, wherein the top wafer stack further comprises a first topping wafer and a second topping wafer.

5. The MEMS strain gauge pressure sensor of claim 4, wherein a thickness of the first topping wafer is equal to a thickness of the backing wafer.

6. The MEMS strain gauge pressure sensor of claim 4, wherein the first topping wafer further comprises a first channel configured to communicate the first fluid to the first cavity, and wherein the first channel has a first opening adjacent the pedestal and a second opening at the first cavity.

7. The MEMS strain gauge pressure sensor of claim 6, wherein the backing wafer further comprises a second channel configured to deliver the second fluid to the second cavity, and wherein the second channel has a first opening adjacent the pedestal and a second opening at the second cavity.

8. A method of fabricating a microelectromechanical system (MEMS) strain gauge pressure sensor, the method comprising:
   forming a wafer stack, the wafer stack including a first wafer, a second wafer on top of the first wafer, a third wafer on top of the second wafer, and a fourth wafer on top of the third wafer;
   dicing the wafer stack into bars by dicing the wafer stack perpendicularly to the first, second, third, and fourth wafers to expose ends of contact metal layers, each bar comprising:
      a first side with exposed ends of the contact metal layers; and
      a second side opposite the first side;
   assembling the bars into a sheet with a first side corresponding to the first sides of the bars and a second side corresponding to the second sides of the bars;
   depositing an insulation layer onto the first side of the sheet;
   etching the insulation layer to create contact vias;
   depositing contact pads onto the contact vias;
   dicing the bars parallel to the second sides of the bars to expose channel openings;
   depositing a bonding material onto the bars adjacent the channel openings;
   bonding pedestals to the bonding material; and
   dicing the bars into individual MEMS strain gauge pressure sensors, wherein each individual MEMS strain gauge pressure sensor has the structure as described in claim 1.

9. A method of fabricating a microelectromechanical system (MEMS) strain gauge pressure sensor, the method comprising:
   forming a top wafer stack having a top surface and defining a first cavity;
   forming a backing wafer having a bottom surface;
   forming a diaphragm wafer defining a second cavity, the diaphragm wafer comprising:
      a diaphragm configured to deflect from a difference in pressure; and
      a resistor positioned on the diaphragm to sense a deflection of the diaphragm;
   bonding the top wafer stack to the diaphragm wafer and bonding the diaphragm wafer to the backing wafer to form a full wafer stack, such that the diaphragm wafer is positioned between the top wafer stack and the backing wafer, the diaphragm is positioned between the first cavity and the second cavity, and the top surface is opposite the bottom surface; and
   attaching a pedestal laterally to the top wafer stack, the backing wafer, and the diaphragm wafer;
   wherein the MEMS strain gauge pressure sensor has a central axis that is parallel to the top surface and the bottom surface such that the MEMS strain gauge pressure sensor has mechanical symmetries about the central axis.

10. The method of claim 9, wherein a height of the first cavity is equal to a height of the second cavity under vacuum conditions, and wherein attaching the pedestal laterally to the top wafer stack, the backing wafer, and the diaphragm wafer further includes attaching the pedestal symmetrically about the central axis.

11. The method of claim 9, wherein the top wafer stack includes a first topping wafer and a second topping wafer.

12. The method of claim 11, wherein a thickness of the first topping wafer is equal to a thickness of the backing wafer.

13. The method of claim 11, wherein forming the top wafer stack further comprises fusing the first topping wafer and the second topping wafer by silicon fusion bonding.

14. The method of claim 11, wherein forming the top wafer stack further comprises etching the first cavity into the second topping wafer by KOH etching.

15. The method of claim 11, wherein forming the top wafer stack further comprises etching a first channel into the first topping wafer.

16. The method of claim 15, wherein the first channel has a first opening adjacent the pedestal and a second opening at the first cavity.

17. The method of claim 15, wherein forming the backing wafer further comprises etching a second channel into the backing wafer.

18. The method of claim 17, wherein the second channel has a first opening adjacent the pedestal and a second opening at the second cavity.

19. The method of claim 9, wherein forming the diaphragm wafer further comprises:
   depositing a first insulation layer on a first side of the diaphragm wafer;
   depositing a polysilicon layer on the first insulation layer;
   patterning the polysilicon layer;
   depositing a contact metal layer on the polysilicon layer and the first insulation layer;
   patterning the contact metal layer;
   depositing a second insulation layer on the contact metal layer, the polysilicon layer, and the first insulation layer;
   depositing a third insulation layer on a second side of the diaphragm wafer that is opposite the first side; and
   etching the second cavity into the second side of the diaphragm.

20. The method of claim 9, wherein bonding the top wafer stack to the diaphragm wafer and bonding the diaphragm wafer to the backing wafer each comprises glass frit bonding.

* * * * *